(12) United States Patent
Nagao et al.

(10) Patent No.: US 11,101,506 B2
(45) Date of Patent: Aug. 24, 2021

(54) MOBILE DEVICE FOR DETERMINING MAGNITUDE OF LIGHT VOLUME, METHOD FOR CONTROLLING MOBILE DEVICE THEREOF AND NON-TRANSITORY STORAGE MEDIUM THEREOF

(71) Applicant: KYOCERA Corporation, Kyoto (JP)

(72) Inventors: Tomomi Nagao, Kawasaki (JP); Hidetoshi Hachiya, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 445 days.

(21) Appl. No.: 16/087,097

(22) PCT Filed: Mar. 16, 2017

(86) PCT No.: PCT/JP2017/010563
§ 371 (c)(1),
(2) Date: Sep. 21, 2018

(87) PCT Pub. No.: WO2017/164048
PCT Pub. Date: Sep. 28, 2017

(65) Prior Publication Data
US 2021/0098834 A1    Apr. 1, 2021

(30) Foreign Application Priority Data
Mar. 25, 2016  (JP) .............................. JP2016-061106

(51) Int. Cl.
*H01M 10/46*   (2006.01)
*H02J 50/30*   (2016.01)
*H01L 31/042*  (2014.01)

(52) U.S. Cl.
CPC ........ *H01M 10/465* (2013.01); *H01L 31/042* (2013.01); *H02J 50/30* (2016.02)

(58) Field of Classification Search
CPC .............. H01L 31/042; H01L 31/0445; H01M 10/465; H01M 1/724; H01M 2250/12; H02J 50/30
See application file for complete search history.

(56) References Cited

U.S. PATENT DOCUMENTS 6,046,827 A * 4/2000 Ogoshi .............. H04N 1/40056
358/487
6,430,378 B1 * 8/2002 Ozawa ............... H04N 1/00002
358/406
(Continued)

FOREIGN PATENT DOCUMENTS

JP    2002-359676 A    12/2002
JP    2006-211019 A    8/2006
(Continued)

*Primary Examiner* — Helen Rossoshek
(74) *Attorney, Agent, or Firm* — Hauptman Ham, LLP

(57) ABSTRACT

A mobile device includes an outer package, a first solar panel, and a controller. The first solar panel includes a plurality of first photoelectric converters generating electrical power based on light which enters from a first surface of the outer package and being disposed side by side. The controller determines a magnitude of a light volume of light entering the first solar panel for each of the plurality of the first photoelectric converters, and executes notification processing of transmitting an instruction to provide a notification based on a total number of first photoelectric converters whose light volume is determined to be large in the plurality of the first photoelectric converters.

17 Claims, 16 Drawing Sheets

(56) References Cited

U.S. PATENT DOCUMENTS

| | | | |
|---|---|---|---|
| 6,829,008 B1* | 12/2004 | Kondo | H04N 5/23212 |
| | | | 348/302 |
| 7,109,528 B2* | 9/2006 | Nakata | H01L 25/0753 |
| | | | 257/100 |
| 7,535,494 B2* | 5/2009 | Suzuki | H04N 5/2352 |
| | | | 348/220.1 |
| 8,295,892 B2* | 10/2012 | Kim | H04M 1/21 |
| | | | 455/574 |
| 9,088,181 B2* | 7/2015 | Akin | H02J 7/00 |
| 9,413,155 B2* | 8/2016 | Blemel | H02H 7/20 |
| 10,506,854 B2* | 12/2019 | Akin | H01M 50/213 |
| 10,554,072 B1* | 2/2020 | Lim | G06F 1/1626 |
| 10,857,762 B2* | 12/2020 | Okuyama | B32B 27/34 |
| 2008/0100258 A1* | 5/2008 | Ward | H01M 10/465 |
| | | | 320/101 |
| 2009/0114210 A1* | 5/2009 | Guice | F24S 30/425 |
| | | | 126/569 |
| 2009/0273481 A1* | 11/2009 | Traywick | H01M 10/465 |
| | | | 340/636.1 |
| 2010/0167797 A1 | 7/2010 | Morichi | |
| 2010/0237895 A1* | 9/2010 | Chung | G01J 1/08 |
| | | | 324/761.01 |
| 2011/0319137 A1* | 12/2011 | Takagi | H04B 1/3883 |
| | | | 455/566 |
| 2012/0235963 A1 | 9/2012 | Oshinome et al. | |
| 2012/0310821 A1* | 12/2012 | Abramowitz | G09F 27/007 |
| | | | 705/39 |
| 2019/0109935 A1* | 4/2019 | Nagao | H01L 31/0468 |
| 2019/0129470 A1* | 5/2019 | Hasei | G04R 20/02 |
| 2020/0161486 A1* | 5/2020 | Pugh | H01L 31/05 |

FOREIGN PATENT DOCUMENTS

| | | |
|---|---|---|
| JP | 2009-10945 A | 1/2009 |
| JP | 2012-194811 A | 10/2012 |
| JP | 2015-12579 A | 1/2015 |

* cited by examiner

US 11,101,506 B2

MOBILE DEVICE FOR DETERMINING MAGNITUDE OF LIGHT VOLUME, METHOD FOR CONTROLLING MOBILE DEVICE THEREOF AND NON-TRANSITORY STORAGE MEDIUM THEREOF

CROSS-REFERENCE TO RELATED APPLICATION

The present application is a National Phase entry based on PCT Application No. PCT/JP2017/010563 filed on Mar. 16, 2017, entitled "MOBILE DEVICE, METHOD FOR CONTROLLING MOBILE DEVICE AND NON-TRANSITORY STORAGE MEDIUM," which claims the benefit of Japanese Patent Application No. 2016-061106, filed on Mar. 25, 2016, entitled "MOBILE DEVICE, METHOD FOR CONTROLLING MOBILE DEVICE, CONTROLLER OF MOBILE DEVICE AND CONTROL PROGRAM".

TECHNICAL FIELD

Embodiments of the present disclosure relate to a mobile device, a method for controlling the mobile device, and a non-transitory storage medium.

BACKGROUND ART

A mobile device including a solar cell module as a solar panel is conventionally proposed.

SUMMARY

A mobile device, a method for controlling the mobile device, and a non-transitory storage medium are disclosed. In one embodiment, a mobile device comprises an outer package, a first solar panel, and a controller. The first solar panel comprises a plurality of first photoelectric converters generating electrical power based on light which enters from a first surface of the outer package and being disposed side by side. The controller determines a magnitude of a light volume of light entering a first solar panel for each of the plurality of the first photoelectric converters, and executes notification processing of transmitting an instruction to provide a notification based on a total number of first photoelectric converters whose light volume is determined to be large in the plurality of the first photoelectric converters.

In another one embodiment, a method for controlling the mobile device comprises a first step and a second step. In the first step, a magnitude of a light volume of light entering a first solar panel, which includes a plurality of first photoelectric converters, is determined for each of the plurality of the first photoelectric converters, the plurality of the first photoelectric converters generating electrical power based on light which enters from a first surface of an outer package of the mobile device and being disposed side by side. In the second step, notification processing of transmitting an instruction to provide a notification is executed based on a total number of first photoelectric converters whose light volume is determined to be large in the plurality of the first photoelectric converters.

In another one embodiment, a non-transitory computer readable storage medium stores a control program. The control program makes a mobile device determine a magnitude of a light volume of light entering a first solar panel, which includes a plurality of first photoelectric converters, for each of the plurality of the first photoelectric converters, the plurality of first photoelectric converters generating electrical power based on light entering from a first surface of an outer package of the mobile device and being disposed side by side, and makes the mobile device execute notification processing of transmitting an instruction to provide a notification based on a total number of first photoelectric converters whose light volume is determined to be large in the plurality of the first photoelectric converters.

Effects of the Invention

According to the mobile device, the method for controlling the mobile device, and the non-transitory storage medium, it is easy for a user to recognize to what degree of range light enters in a solar panel.

DESCRIPTION OF EMBODIMENT(S)

Figure 1:
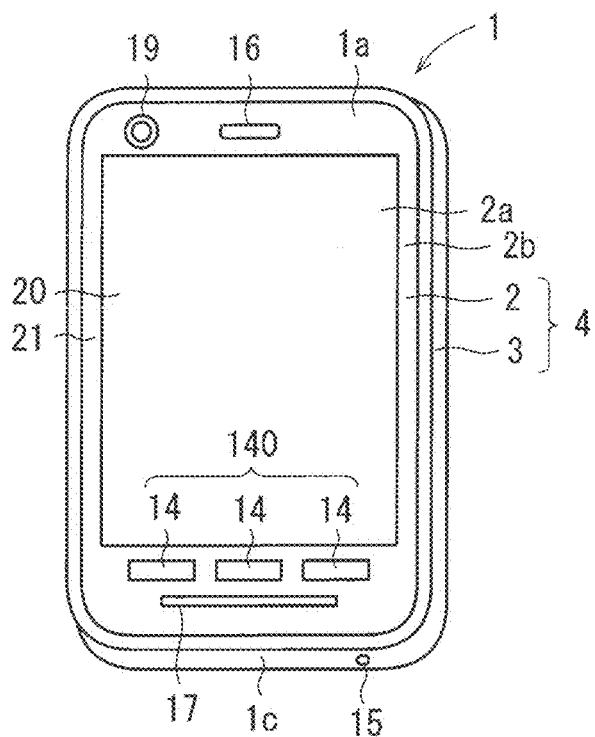
FIG. 1 A perspective view schematically showing one example of an external appearance of a mobile device.

Each example and various modification examples of embodiments are described based on the drawings hereinafter. The same reference numerals will be assigned to a similar configuration and function in the drawings, and a duplicate description is omitted in the description below. The drawings are schematically illustrated, thus a size and a positional relationship of various types of structures in each drawing may be appropriately changed.

<1. One Example of External Appearance of Mobile Device>

Figure 2:
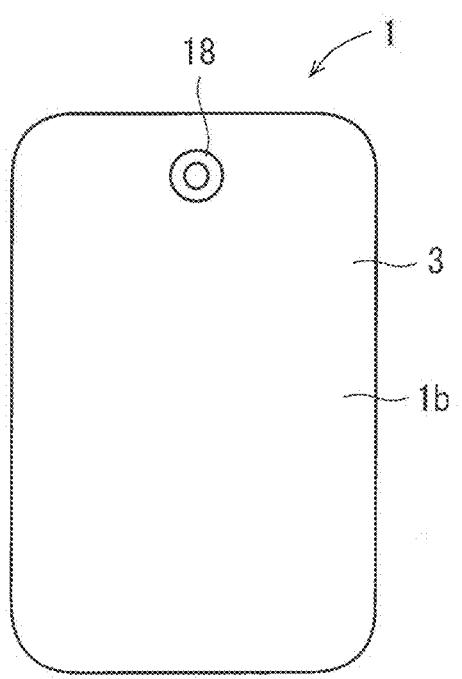
FIG. 2 A rear view schematically showing one example of the external appearance of the mobile device.

FIG. 1 is a perspective view schematically showing one example of an external appearance of a mobile device 1. FIG. 2 is a rear view schematically showing one example of the external appearance of the mobile device 1. The mobile device 1 is, for example, a mobile device such as a smartphone. For example, the mobile device 1 may be able to communicate with another communication apparatus through a base station, a server, and the like.

As shown in FIG. 1 and FIG. 2, the mobile device 1 comprises an outer package (housing) 4. For example, the outer package 4 has a cover panel 2 located in a front surface 1a of the mobile device 1 and a device case 3 to which the cover panel 2 is attached. The outer package 4 of the mobile device 1 has, for example, a plate shape substantially rectangular in a plan view.

A display panel 121, a touch panel 130, and a solar panel 210, which will be described below, are located on a back surface side of the cover panel 2. The cover panel 2, the display panel 121, the touch panel 130, and the solar panel 210 are disposed to overlap in parallel with each other. For example, the touch panel 130 is attached to a back surface of the cover panel 2, the solar panel 210 is attached to a back surface of the touch panel 130, and the display panel 121 is attached to a back surface of the solar panel 210.

The cover panel 2 has transparency, and a surface screen 2a, in which various types of information such as characters, symbols, and graphics are displayed by the display panel 121 are displayed, is located in the cover panel 2. A peripheral part 2b surrounding the display screen 2a in the cover panel 2 is mostly black through, for example, application of a film. Most of the peripheral part 2b of the cover panel 2 accordingly serves as a non-display area on which the various types of information, which are displayed by the display panel 120, are not displayed.

The touch panel 130 has transparency, and can detect an operator (a finger of a user, for example) touching or being close to the display screen 2a. The user can provide various instructions to the mobile device 1 by operating the display screen 2a with the operator.

The solar panel 210 has transparency, and can generate electrical power based on light entering through the cover panel 2, for example. The generated electrical power can be used as a power source of the mobile device 1. "The light" herein includes not only visible light but also invisible light.

As shown in FIG. 1, located in an upper-side end portion of the cover panel 2 is a second-lens transparent member 19 that enables a lens of a second imaging unit 190, which will be described below, to be visually recognized from outside of the mobile device 1. Located in the upper-side end portion of the cover panel 2 is a receiver hole 16. Located in a lower-side end portion of the cover panel 2 is a speaker hole 17. A microphone hole 15 is located in a bottom surface 1c of the mobile device 1, that is to say, a bottom surface (a lower side surface) of the device case 3.

As shown in FIG. 2, located in a rear surface 1b of the outer package 4 of the mobile device 1, that is to say, an upper-side end portion of a rear surface of the device case 3 is a first-lens transparent member 18 that enables a lens of a first imaging unit 180, which will be described below, to be visually recognized from the outside of the mobile device 1.

Located inside the device case 3 is an operation button group 140 including a plurality of operation buttons 14. Each operation button 14 is a hardware button such as a press button, for example. The operation button is referred to as the "operation key" or the "key" in some cases. Each operation button 14 is exposed from the lower-side end portion of the cover panel 2, for example. The user can provide various instructions to the mobile device 1 by operating each operation button 14 with the finger, for example.

The plurality of operation buttons 14 include a home button, a back button, and a history button, for example. The home button is an operation button for displaying a home screen (an initial screen) on the display screen 2a. The back button is an operation button for switching a display on the display screen 2a to an immediately preceding display. The history button is an operation button to display a list of an application executed by the mobile device 1 on the display screen 2a.

<2. Example of Electrical Configuration of Mobile Device>

Figure 3:
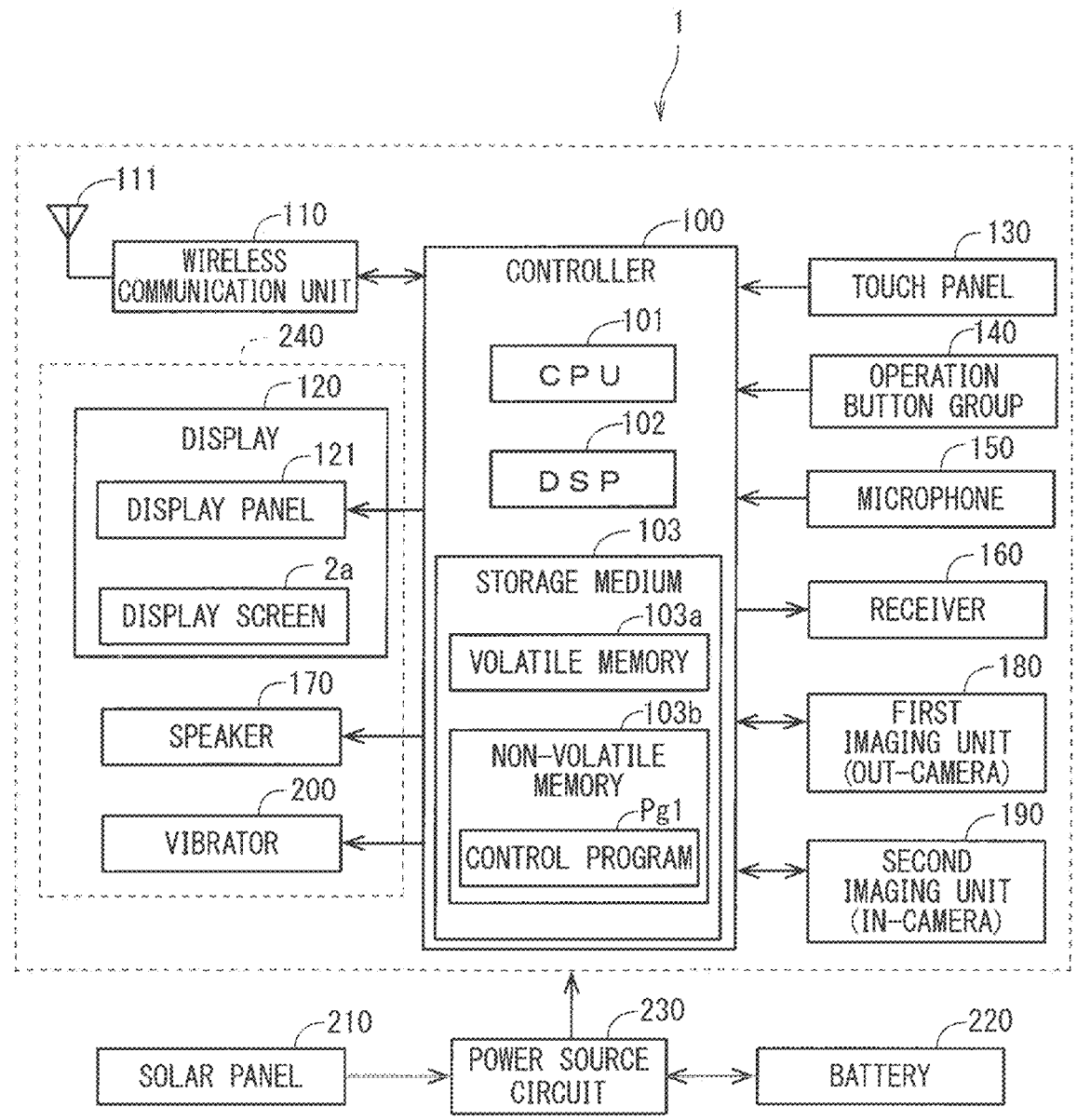
FIG. 3 A block diagram schematically showing one example of an electrical configuration of the mobile device.

FIG. 3 is a block diagram schematically showing one example of an electrical configuration of the mobile device 1. As shown in FIG. 3, the mobile device 1 comprises a controller 100, a wireless communication unit 110, a display 120, the touch panel 130, a solar panel 210, an operation button group 140, a speaker 170, and a vibrator 200. The mobile device 1 further comprises a microphone 150, a receiver 160, the first imaging unit 180, the second imaging unit 190, a power source circuit 230, and a battery 220. The outer package 4 of the mobile device 1 houses therein the components described above.

The controller 100 controls the other components of a mobile device 1 to be able to collectively manage the operation of the mobile device 1. The controller 100 is also considered as a control circuit. The controller 100 includes at least one processor for providing control and processing capability to execute various functions as described in detail below.

In accordance with various embodiments, the at least one processor may be implemented as a single integrated circuit (IC) or as multiple communicatively coupled IC's and/or discrete circuits. The at least one processor can be executed in accordance with various known techniques.

In one embodiment, the processor includes one or more circuits or units configured to perform one or more data computing procedures or processes by executing instructions stored in an associated memory, for example. In the other embodiment, the processor may be firmware configured to perform one or more data computing procedures or processes (a discrete logic component, for example).

In accordance with various embodiments, the processor may include one or more processors, controllers, microprocessors, microcontrollers, application specific integrated circuits (ASICs), digital signal processors, programmable logic devices, field programmable gate arrays, or any combination of these devices or structures, or other known devices and structures, to perform the functions described hereinafter.

In the present example, the controller 100 is a type of an arithmetic processing unit, for example, and includes a central processing unit (CPU) 101 and a digital signal processor (DSP) 102 which are electrical circuits and a storage medium 103, for example. The controller 100 controls the other components of the mobile device 1 to be able to collectively manage the operation of the mobile device 1. The mobile device 1 may further include a co-processor such as a system-on-a-chip (SoC), a micro control unit (MCU), and a field-programmable gate array (FPGA), for example. The mobile device 1 may perform various types of control by making the central processing unit (CPU) and the co-processor cooperate with each other or using selectively one of them.

The storage medium 103 is a storage medium which the CPU 101 and the DSP 102 can read, and may include a volatile memory 103a and a non-volatile memory 103b. The volatile memory 103a is a random access memory (RAM), for example, and the non-volatile memory 103b is a read only memory (ROM), for example. The ROM of the storage medium 103 is, for example, a flash ROM (flash memory) that is a non-volatile memory. The storage medium 103 stores a main program and a plurality of application programs (also simply referred to as the "applications" in some cases hereinafter) to control the mobile device 1. The CPU 101 and the DSP 102 execute the various programs in the storage medium 103 to achieve various functions of the controller 100. The storage medium 103 stores, for example, a call application to perform a voice call and a video call and an imaging application to take a still image or a video using the first imaging unit 180 or the second imaging unit 190. The application stored in the storage medium 103 includes a control program Pg1 for controlling the mobile device 1, for example.

The storage medium 103 may include a non-transitory computer readable storage medium other than the ROM and the RAM. The storage medium 103 may include, for example, a compact hard disk drive and a solid state drive (SSD). A storage medium other than the storage medium 103 may be located. This storage medium may be located outside the controller 100. Information described hereinafter may be stored in the storage medium 103 or the other storage medium. All or some of the functions of the controller 100 may be achieved by hardware that needs no software to achieve the functions above. In short, the controller 100 needs to be made up of a circuit.

The wireless communication unit (communication circuit) 110 is a so-called communication interface, and includes an antenna 111. The wireless communication unit 110 can receive, for example, a signal from a communication apparatus different from the mobile device 1 or a signal from a communication apparatus such as a web server connected to Internet through the antenna 111 via a base station. The wireless communication unit 110 can amplify and down-convert the signal received by the antenna 111 and then output a resultant signal to the controller 100. The controller 100 can, for example, modulate the received signal, which has been input, to acquire various types of information (such as a sound signal indicative of the voice or music) contained in the received signal.

The wireless communication unit 110 can also up-convert and amplify a transmission signal generated by the controller 100 to wirelessly transmit the processed transmission signal from the antenna 111. The transmission signal from the antenna 111 is received, via the base station, by the mobile phone different from the mobile device 1 or the communication apparatus such as the web server connected to Internet, for example.

The display 120 includes the display panel 121 and the display screen 2a. The display panel 121 is a liquid crystal panel or an organic electroluminescence (EL) panel, for example. The display panel 121 can display various types of information such as characters, symbols, and graphics under the control of the controller 100. The various types of information, which the display panel 121 displays, are displayed on the display screen 2a.

The touch panel 130 is, for example, a projected capacitive touch panel. The touch panel 130 can detect an operation performed on the display screen 2a with the operator such as the finger. When the user operates the display screen 2a with the operator such as the finger, an electrical signal corresponding to the operation is input from the touch panel 130 to the controller 100. The controller 100 can accordingly specify contents of the operation performed on the display screen 2a based on the electrical signal from the touch panel 130, thereby performing processing in accordance with the contents. The user can also provide the various instructions to the mobile device 1 by operating the display screen 2a with, for example, a pen for capacitive touch panel such as a stylus pen, instead of the operator such as the finger.

When the user operates each operation button 14 of the operation button group 140, the operation button 14 can output to the controller 100 an operation signal indicating that the operation button 14 has been operated. The controller 100 can accordingly determine whether or not each operation button 14 has been operated based on the operation signal from each operation button 14. The controller 100 can perform the processing corresponding to the operation button 14 that has been operated. It is also applicable that each operation button 14 is not a hardware button such as a press button, for example, but a software button displayed on the display screen 2a. In this case, the touch panel 130 detects the operation performed on the software button, thus the controller 100 can perform the processing corresponding to the software button that has been operated.

The microphone 150 can convert a sound being input from the outside of the mobile device 1 into an electrical sound signal and then output the electrical sound signal to the controller 100. The sound from the outside of the mobile device 1 is, for example, taken inside the mobile device 1 through the microphone hole 15 located in the bottom surface (lower side surface) 1c of the device case 3 and input to the microphone 150.

The speaker 170 is, for example, a dynamic speaker. The speaker 170 can convert an electrical sound signal from the controller 100 into a sound and then output the sound. The sound being output from the speaker 170 is, for example, output to the outside of the mobile device 1 through the speaker hole 17 located in the lower-side end portion of the cover panel 2. The sound being output from the speaker hole 17 is set to a volume large enough to be heard in the place apart from the mobile device 1.

The receiver 160 is made up of, for example, a dynamic speaker. The receiver 160 can convert an electrical sound signal from the controller 100 into a sound and then output the sound. The receiver 160 outputs a received sound, for example. The sound being output from the receiver 160 is, for example, output outside through the receiver hole 16 located in the upper-side end portion of the cover panel 2. A volume of the sound being output through the receiver hole 16 is set to be smaller than a volume of the sound being output from the speaker 170 through the speaker hole 17.

The receiver 160 may be replaced with a piezoelectric vibration element. The piezoelectric vibration element can vibrate based on a voice signal from the controller 100. The piezoelectric vibration element is located in, for example, a back surface of the cover panel 2 and can vibrate, through its vibration based on the sound signal, the cover panel 2. When the user brings the cover panel 2 close to his/her ear, the vibration of the cover panel 2 is transmitted to the user as a voice. The receiver hole 16 is not necessary when the receiver 160 is replaced with the piezoelectric vibration element.

Each of the first imaging unit 180 and the second imaging unit 190 includes a lens and an image sensor, for example. The controller 100 controls the first imaging unit 180. The first imaging unit 180 can receive light in the imaging sensor through the first-lens transparent member 18 and the lens to generate a taken image, and can output the taken image to the controller 100. The controller 100 controls the second imaging unit 190. The second imaging unit 190 can receive light in the imaging sensor through the second-lens transparent member 19 and the lens to generate a taken image, and can output the taken image to the controller 100. These taken images may be still images. Alternatively, the first imaging unit 180 and the second imaging unit 190 may generate the taken image repeatedly (periodically) to generate the video.

The lens of the first imaging unit 180 can be visually recognized from the first-lens transparent member 18 located in the rear surface 1b of the mobile device 1. The first imaging unit 180 can thus take an image of an object located on the rear surface 1b side of the mobile device 1. The first imaging unit 180 above is also referred to as an "out-camera" in some cases.

The lens of the second imaging unit 190 can be visually recognized from the second-lens transparent member 19 located in the front surface 1a of the mobile device 1. The second imaging unit 190 can thus take an image of an object located on the front surface 1a side of the mobile device 1. The second imaging unit 190 above is also referred to as an "in-camera" in some cases.

The vibrator 200 vibrates based on the instruction from the controller 100. The vibration is transmitted to the outer package 4 of the mobile device 1. Thus, if the user touches the outer package 4 of the mobile device 1, the vibration is transmitted to the user via the outer package 4. The user can accordingly receive the notification from the mobile device 1. The vibrator 200 has a vibration motor (for example, an eccentric motor or a linear motor) or a piezoelectric vibration element, for example.

Since the display 120, the speaker 170, and the vibrator 200 can provide the user with the notification, they can be deemed as a notification unit 240. The notification unit 240 may include a single or a plurality of light-emitting elements outputting light (for example, light-emitting diodes). The notification can be provided to the user by the light emission from the light-emitting element. The light-emitting element may emit the light continuously or blink. The light-emitting element is located in at least one of the front surface 1a and the rear surface 1b.

Figure 4:
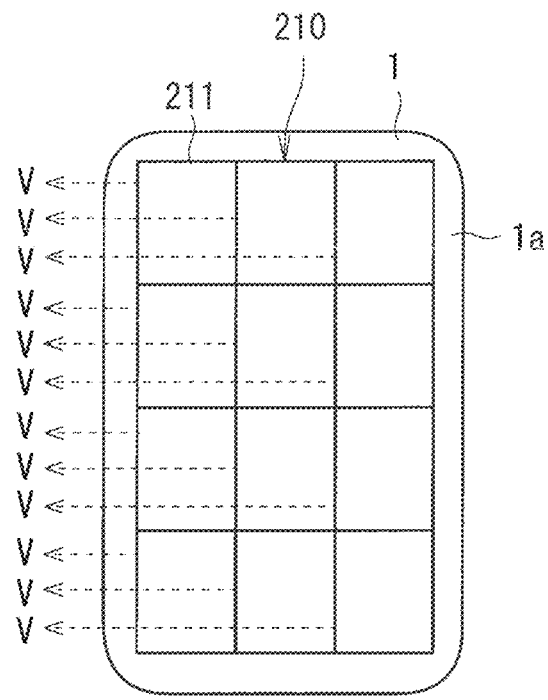
FIG. 4 A drawing schematically showing one example of a configuration of a solar panel.

The solar panel 210 has a plurality of photoelectric converters (described hereinafter). FIG. 4 is a drawing schematically showing one example of a configuration of the solar panel 210. As shown in FIG. 4, a plurality of photoelectric converters 211 are disposed side by side in a plane of the solar panel 210. Each photoelectric converter 211 has a rectangular shape in a plan view, and is disposed in a lattice pattern. In the illustration in FIG. 4, the twelve photoelectric converters 211, four arranged longitudinally and three arranged laterally, form the solar panel 210.

Each photoelectric converter 211 generates electrical power based on the light entering from the front surface 1a of the outer package 4, and outputs a voltage V. That is to say, the solar panel 210 outputs the voltage V to each photoelectric converter 211. In the illustration in FIG. 4, a dashed arrow extending from each photoelectric converter 211 indicates that each photoelectric converter 211 outputs the voltage V.

The photoelectric converter 211 has a solar cell element. The solar cell element has a pair of semiconductors having a PN junction and a pair of electrodes each connected to the pair of semiconductors. If the light enters the semiconductors, the electrical power is generated at an interface of the PN junction by a photoelectric effect.

The pair of semiconductors have transparency, and are semiconductors having a band gap energy of 3 eV or higher, for example. An oxide semiconductor made of zinc oxide, for example, can be adopted as such semiconductors.

The voltage generated in the semiconductors is applied to the pair of electrodes. The pair of electrodes also have transparency. An indium tin oxide (ITO) film, for example, can be adopted as such electrodes.

The photoelectric converter 211 outputs the voltage V applied to the pair of electrodes. The photoelectric converter 211 does not necessarily have the single solar cell element, but may have the plurality of solar cell elements. In this case, the plurality of solar cell elements are connected to each other in each photoelectric converter 211. For example, the plurality of solar cell elements may be connected in series with each other, or may be connected in parallel with each other. Alternatively, a group of the plurality of solar cell elements connected in series may be connected in parallel with each other. If the plurality of solar cell elements are connected in series, the photoelectric converter 211 outputs the voltage V which is generated in the whole plurality of solar cell elements connected in series with each other. Accordingly, the voltage V can be increased. If the plurality of solar cell elements are connected in parallel, the photoelectric converter 211 outputs voltage V of each of the plurality of solar cell elements. Accordingly, a current being output from the photoelectric converter 211 can be increased. If the current increases, the battery 220 can be rapidly charged. The photoelectric converter having the plurality of solar cell elements is referred to as a module in some cases.

Figure 5:
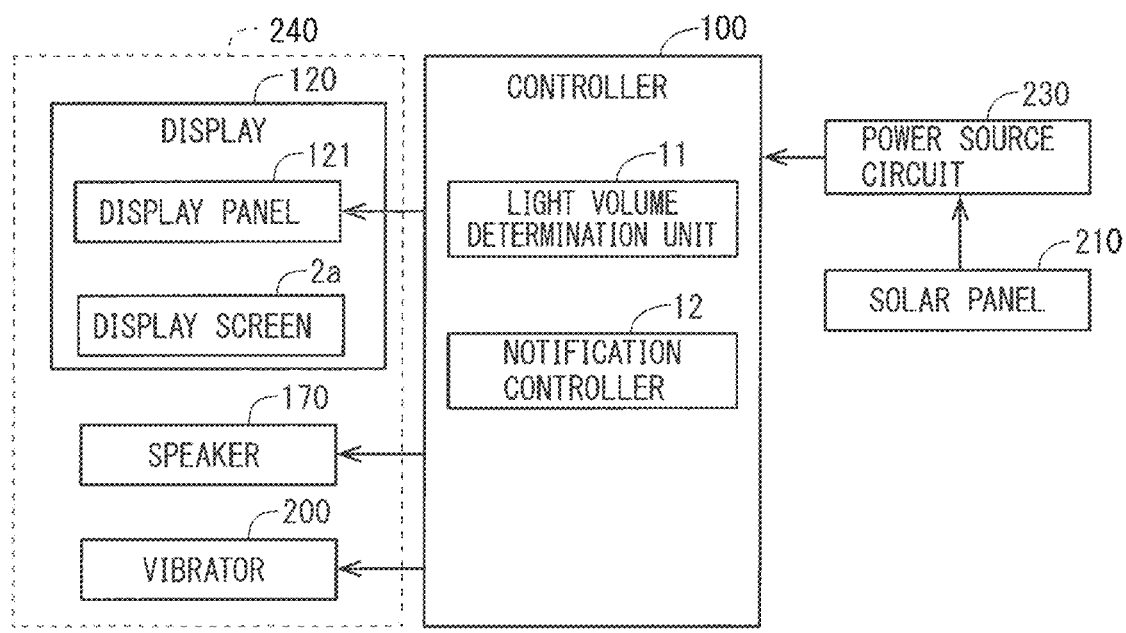
FIG. 5 A block diagram schematically showing one example of an internal configuration of a controller.

The voltage V generated in each photoelectric converter 211 is output to the power source circuit 230 (also refer to FIG. 5). For example, in the power source circuit 230, the voltage obtained in the photoelectric converters 211 connected in series or in parallel may be used as a power source voltage of the mobile device 1. Alternatively, it is also applicable to use, in the power source circuit 230, the voltage obtained by connecting the group of the plurality of photoelectric converters 211, which are connected in series with each other, in parallel with each other as the power source voltage. The power source circuit 230 can output the power source voltage to the battery 220 to charge the battery 220, or can output the power source voltage to various configurations included in the mobile device 1. The power source circuit 230 can also output the voltage from the battery 220 to the various configurations as the power source voltage.

The power source circuit 230 can detect the voltage V, the current, or the electrical power being output from each photoelectric converter 211 as a parameter indicating an amount of light (light volume) entering each photoelectric converter 211, and can output a detection value thereof to the controller 100. It is applicable to, for example, locate a switch between output terminals of the photoelectric converters 211, detect a short-circuit current flowing when the switch in each photoelectric converter 211 is on, and output a detection value thereof to the controller 100. Since the short-circuit current gets large as the light volume increases, the controller 100 can recognize the light volume based on the short-circuit current.

The configuration of detecting the output from each photoelectric converter 211 is not necessarily be located in the power source circuit 230. A detector detecting the output from the photoelectric converter 211 may be located separately from the power source circuit 230.

<3. One Example of Controller>

FIG. 5 is a function block diagram illustrating one example of an internal configuration of the controller 100. The controller 100 includes a light volume determination unit 11 and a notification controller 12. The light volume determination unit 11 can determine whether or not the amount of light entering the photoelectric converter 211 is larger than a predetermined light volume reference value. As one example of a specific processing, the light volume determination unit 11 can determines a magnitude relationship between the output from the photoelectric converter 211 being input from the power source circuit 230 (the short-circuit current, for example) and a predetermined output reference value. If the output from the photoelectric converter 211 is larger than the output reference value, the light volume determination unit 11 determines that the amount of light entering the photoelectric converter 211 is larger than the light volume reference value. In the similar manner, if the output is smaller than the output reference value, the light volume determination unit 11 determines that the amount of light entering the photoelectric converter 211 is smaller than the light volume reference value. The output reference value may be preset and stored in a storage medium, for example. The determination of the magnitude relationship can be performed using a comparator.

Light having a light volume larger than the light volume reference value is also referred to as a strong light, and light having a light volume smaller than the light volume reference value is also referred to as a weak light hereinafter. The "weak light" includes light whose light volume is zero.

The light volume determination unit 11 can calculate a total number of the photoelectric converters 211 which the strong light enters (also referred to as the number of light-receiving units), and output the number of light-receiving units to the notification controller 12. It is deemed that as the number of light-receiving units increases, the strong light enters a wider range of the solar panel 210.

The notification controller 12 can instruct the notification unit 240 to provide a notification based on the number of the photoelectric converters 211 which the strong light enters. For example, the display panel 121 displays a notification screen based on the instruction. The notification screen may display the number of light-receiving units, for example. Alternatively, the speaker 170 may output the sound based on the instruction, the vibrator 200 may vibrate based on the instruction, or a light-emitting element (not shown in the drawing) on the front surface 1a side emits the light based on the instruction. The notification controller 12 needs to instruct at least one of them to provide the notification.

<3-1. Specific Example of Operation Described Above of Controller>

Figure 6:
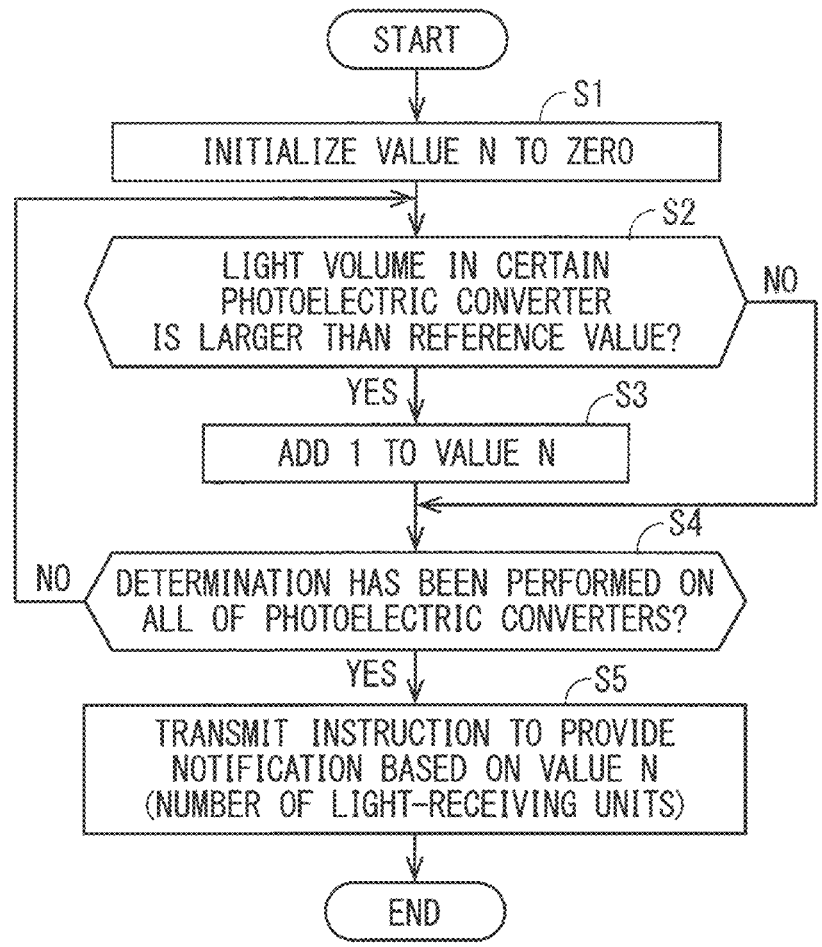
FIG. 6 A flow chart showing one example of an operation of the controller.

FIG. 6 is a flow chart illustrating one example of the operation described above of the controller 100. The controller 100 may execute a series of operations shown in FIG. 6 periodically and repeatedly, for example. Firstly, in Step S1, the light volume determination unit 11 initializes a value N to zero. The value N comes to coincide with the number of light-receiving units by executing Steps S2 to S4 described hereinafter.

Next, in Step S2, the light volume determination unit 11 determines whether or not the amount of light entering a certain photoelectric converter 211 is larger than the light volume reference value. If the light volume determination unit 11 determines that the light volume is larger than the light volume reference value, the light volume determination unit 11 adds one to the value N in Step S3.

Subsequent to Step S3, or if the light volume determination unit 11 determines that the light volume is smaller than the light volume reference value in Step S2, the light volume determination unit 11 determines whether or not the determination on the light volume has been performed on all of the photoelectric converters 211 in Step S4. If the light volume determination unit 11 determines that the determination has not been performed on all of the photoelectric converter 211, the light volume determination unit 11 executes Step S2 on the other photoelectric converter 211 again. If the light volume determination unit 11 determines that the determination has been performed on all of the photoelectric converters 211, the notification controller 12 instructs the notification unit 240 to provide the notification based on the value N calculated by the light volume determination unit 11 (that is to say, the number of light-receiving units). The notification unit 240 provides the notification in accordance with the instruction.

This notification enables the user to learn of a degree of number of the photoelectric converters 211 which the light enters. That is to say, the user easily recognizes to what degree of range the light enters in the solar panel 210. A specific example of the notification is described below.

<4. Notification>

<4-1. Notification Regarding Power Generation Amount>

Figure 7:
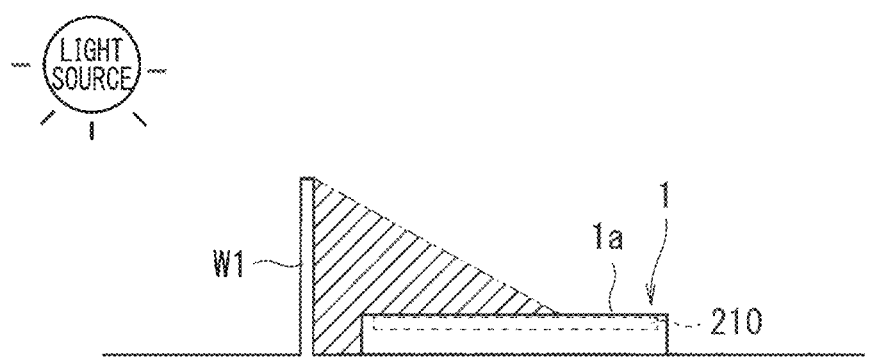
FIG. 7 A drawing schematically showing one example of a state where the mobile device is disposed.

FIG. 7 is a drawing schematically showing one example of a state where the mobile device 1 is disposed. In the illustration in FIG. 7, part of the light from a light source is blocked by an object W1, so that the other part of the light enters only a part of the front surface 1a of the mobile device 1 (only a part of the solar panel 210). In the illustration in FIG. 7, a region where the light is blocked by the object W1 is indicated by a diagonal hatching. In a state where the strong light enters only the part of the solar panel 210 as described above, there is a high possibility that the strong light can enter the wider range of the solar panel 210 if the user moves the mobile device 1 a little. In the illustration in FIG. 7, the strong light can enter the wider range of the solar panel 210 if the user moves the mobile device 1 to the right of a sheet of FIG. 7. The power generation amount of the solar panel 210 can be thereby increased.

Figure 8:
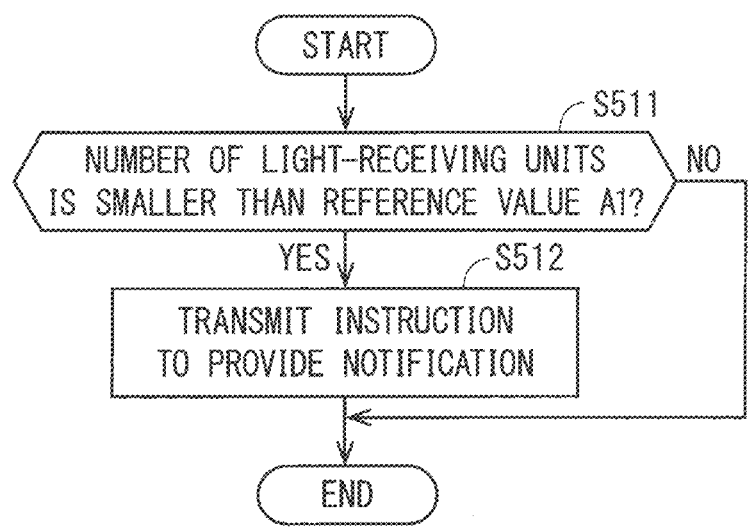
FIG. 8 A flow chart showing one example of an operation of a notification controller.

Accordingly, the mobile device 1 may notify the user of such a state. That is to say, the notification controller 12 may instruct the notification unit 240 to provide the notification if the number of the photoelectric converters 211 which the strong light enters is smaller than a predetermined reference value. FIG. 8 is a flow chart illustrating one example of the operation described above of the notification controller 12. This flow chart corresponds to a specific example of the operation in Step S5 in FIG. 6. In Step S511, the notification controller 12 determines whether or not the number of light-receiving units is smaller than a reference value A1. The reference value A1 may be preset and stored in a storage medium, for example.

If the notification controller 12 determines that the number of light-receiving units is larger than the reference value A1, the notification controller 12 finishes the processing without instructing the notification unit 240 to provide the notification. That is to say, if the number of the photoelectric converters 211 which the strong light enters is larger than the reference value A1, the notification is not performed based on a consideration that the strong light enters a sufficient range of the solar panel 210. In the meanwhile, if the notification controller 12 determines that the number of light-receiving units is smaller than the reference value A1, the notification controller 12 instructs the notification unit 240 to provide the notification in Step S512. The notification unit 240 provides the notification based on the instruction. That is to say, the notification unit 240 provides the notification to prompt the user to move the mobile device 1 based on consideration that the power generation amount is small if the number of the photoelectric converters 211 which the strong light enters is smaller than the reference value A1.

As described above, the notification controller 12 transmits the instruction to provide the notification if the number of light-receiving units is small. Accordingly, the user can recognize that the power generation amount in the solar panel 210 is small. The user can make the light enter the wider range of the solar panel 210 by moving the mobile device 1 based on the notification. The power generation amount of the solar panel 210 can be thereby increased.

If the number of the photoelectric converters 211 which the strong light enters is zero, there is a possibility that an area around the mobile device 1 is dark, so that the light hardly enters the solar panel 210, for example. In this case, there is a high possibility that the strong light cannot enter the solar panel 210 even if the mobile device 1 moves a little. Thus, if the number of light-receiving units is zero, the notification controller 12 needs not transmit the instruction to provide the notification. For example, if the number of light-receiving units remains zero for a predetermined period of time (for example, several seconds), the operation of the notification controller 12 may be invalidated.

It is also applicable to add a condition where the number of light-receiving units is one or more to the condition for the notification described above. That is to say, if comparatively strong light enters only a part of the solar panel 210 and comparatively weak light (including light having a light volume zero) enters the other part of the solar panel 210, the notification controller 12 may instruct the notification unit 240 to provide the notification. The reason is that there is a high possibility that the strong light can enter the wider range of the solar panel 210 if the mobile device 1 moves a little.

The notification provided when the number of light-receiving units is smaller than the reference value A1 is also referred to the notification regarding the power generation amount hereinafter.

<4-1-1. Static State of Mobile Device 1>

If the user moves while grasping the mobile device 1, the region where the light is received in the solar panel 210 may change. In such a case, the notification regarding the power generation amount is not highly necessary. Thus, it is also applicable the notification processing regarding the power generation amount (the processing in FIG. 6 and FIG. 8) is performed if the mobile device 1 remains still, and the notification processing regarding the power generation amount is not performed if the mobile device 1 spatially moves.

Figure 9:
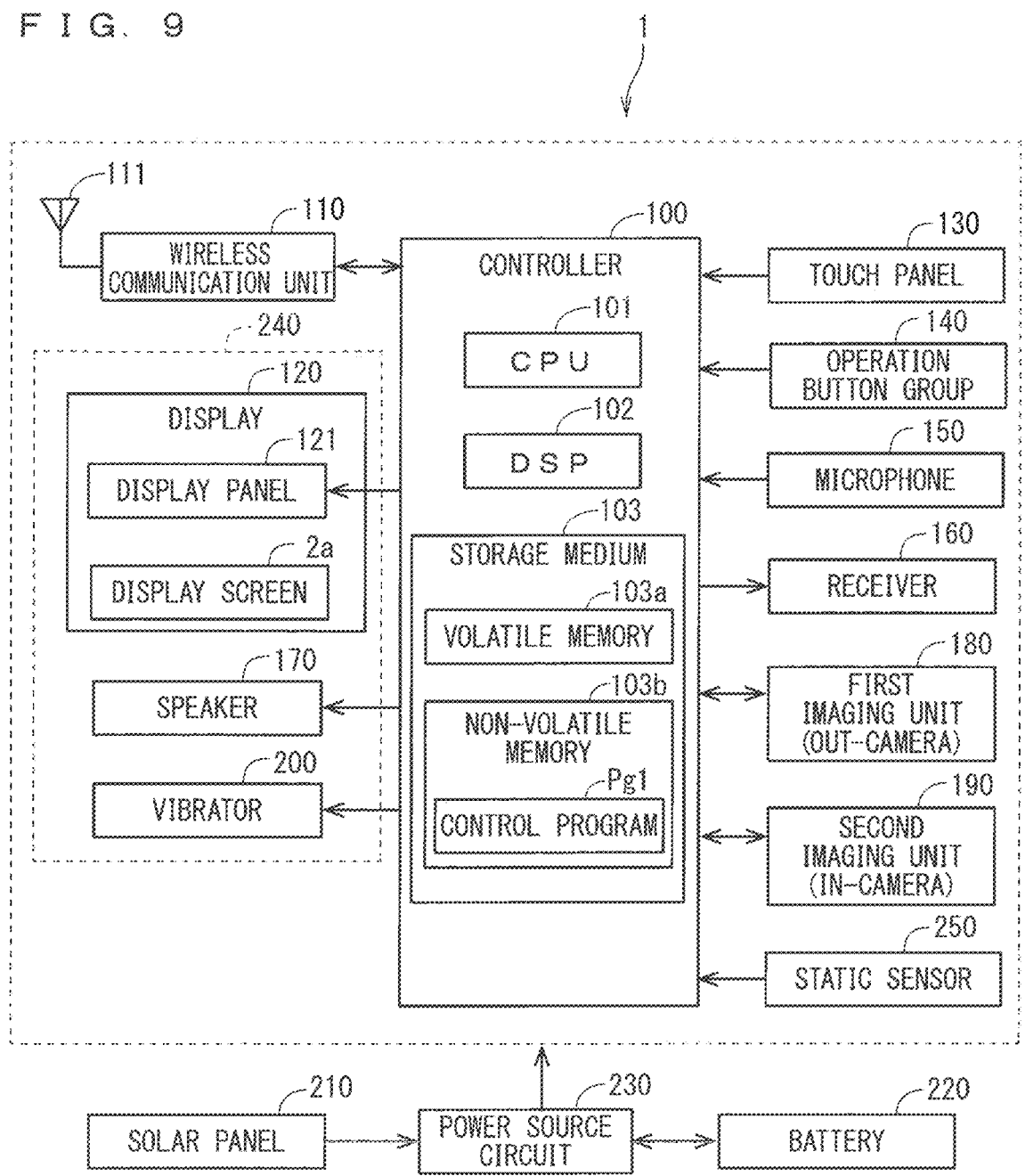
FIG. 9 A block diagram schematically showing one example of the electrical configuration of the mobile device.

FIG. 9 is a block diagram schematically showing another example of the electrical configuration of the mobile device 1. The mobile device 1 further comprises a static sensor 250 compared to FIG. 3. The static sensor 250 can detect a static state of the mobile device 1. In other words, the static sensor 250 can determine whether the mobile device 1 is spatially moving or remains still.

Figure 10:
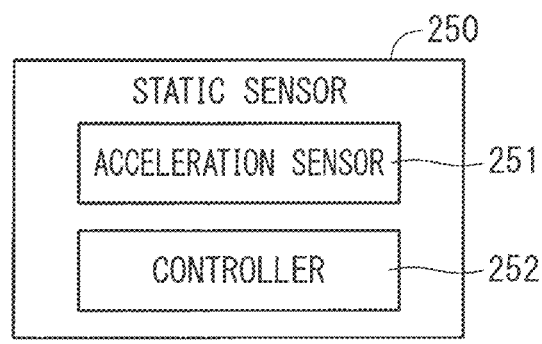
FIG. 10 A block diagram schematically showing one example of an internal configuration of a static sensor.

FIG. 10 is a block diagram schematically showing one example of an internal configuration of the static sensor 250. The static sensor 250 includes an acceleration sensor 251 and a controller 252, for example. The acceleration sensor 251 can detect an acceleration rate in the mobile device 1, convert a value of the detected acceleration rate into an electrical signal, and output the electrical signal to the controller 252. For example, the acceleration sensor 251 can detect the acceleration rate based on an electrostatic capacitance system, a piezoresistance system, or a thermal detection system, for example. The acceleration sensor 251 detects an acceleration component of X, Y, Z axes substantially perpendicular to each other, for example.

The controller 252 recognizes the value of the acceleration rate based on the electrical signal being input from the acceleration sensor 251. A time integration of the acceleration rate indicates a moving speed of the mobile device 1, and a time integration of the moving speed indicates a position (or a movement amount) of the mobile device 1. The controller 252 determines whether the mobile device 1 is spatially moving or remains still based on the acceleration rate. For example, the controller 252 may determine that the mobile device 1 remains still if the acceleration rate is smaller than a first predetermined value over a predetermined period of time. An elapse of the period of time can be measured by a predetermined timing circuit (for example, a timer circuit). The predetermined period of time and the first predetermined value may be preset and stored in a storage medium.

The static sensor 250 may have a gyro sensor instead of the acceleration sensor 251 or together with the acceleration sensor 251. The gyro sensor is a vibration gyro sensor, for example, and detects an angular speed according to a rotational movement of the mobile device 1. The gyro sensor converts a value of the detected angular speed into an electrical signal, and outputs the electrical signal to the controller 252. The controller 252 recognizes the value of the angular speed based on the electrical signal being input from the gyro sensor. The controller 252 determines whether the mobile device 1 is spatially moving or remains still based on the angular speed. For example, the controller 252 may determine that the mobile device 1 remains still if the angular speed is smaller than a second predetermined value over a predetermined period of time. The second predetermined value may be preset and stored in a storage medium.

If both the acceleration sensor 251 and the gyro sensor are located, the controller 252 may determine that the mobile device 1 remains still if the acceleration rate is smaller than the first predetermined value and the angular speed is smaller than the second predetermined value over a predetermined period of time.

A function of the controller 252 may be mounted on the controller 100. In this case, each of the acceleration sensor 251 and the gyro sensor outputs the detection value to the controller 100.

The light volume determination unit 11 and the notification controller 12 execute the operation described above (the operation in FIG. 6 and FIG. 8) if the static sensor 250 detects the static state of the mobile device 1, and does not execute the operation described above if the static sensor 250 does not detect the static state of the mobile device 1.

As described above, the controller 100 performs the notification processing regarding the power generation amount if the mobile device 1 remains still. That is to say, the notification described above can be performed when the notification regarding the power generation amount is highly necessary. In contrast, when the notification regarding the power generation amount is less necessary, the light volume determination unit 11 and the notification controller 12 do not operate, thus a power consumption can be reduced.

Figure 11:
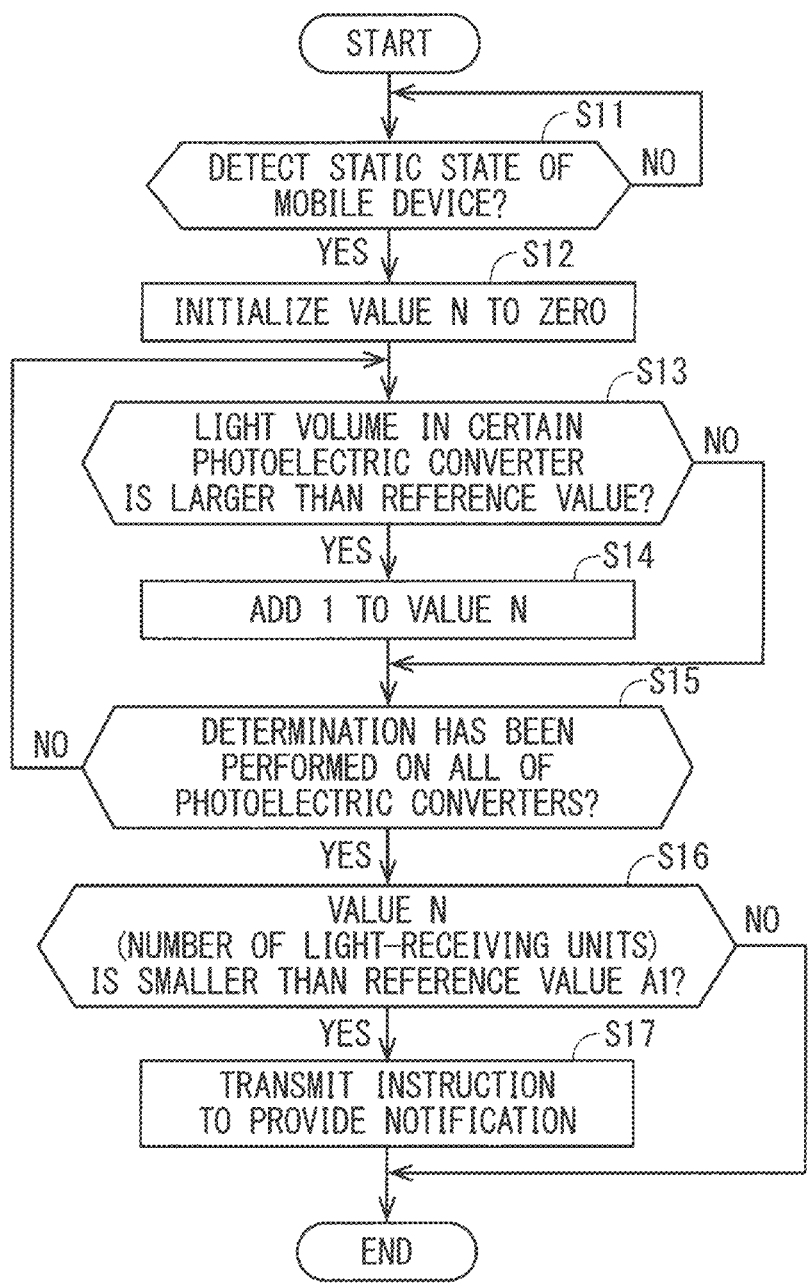
FIG. 11 A flow chart showing one example of the operation of the controller.

FIG. 11 is a flow chart illustrating one example of the operation described above of the controller 100. The controller 100 may execute a series of operations shown in FIG. 11 repeatedly. Firstly, in Step S11, the controller 100 determines whether or not the static sensor 250 detects the static state of the mobile device 1. If the controller 100 determines that the static state of the mobile device 1 is not detected, the controller 100 executes Step S11 again. That is to say, if the controller 100 determines that the mobile device 1 does not remain still, the controller 100 does not execute the notification processing in Steps S12 to S17. In the meanwhile, if the controller 100 determines that the static state of the mobile device 1 is detected, the controller 100 executes Step S12. Steps S12 to S17 are the same as Steps S1 to S4, S511, and S512, respectively.

<4-1-2. Posture of Mobile Device>

In a case where the user actively makes the solar panel 210 generate the electrical power, the user often puts the mobile device 1 with the front surface 1a of the mobile device 1 facing a vertically upper side. The reason is that if the mobile device 1 is disposed on a mounting member with the front surface 1a facing a vertically lower side, the light is blocked by the mounting member, thereby hardly entering the solar panel 210. The light source (for example, the sun or a lighting apparatus) is often located on the vertically upper side, thus also from this viewpoint, the user puts the mobile device 1 with the front surface 1a facing the vertically upper side. In contrast, if the front surface 1a of the mobile device 1 does not face the vertically upper side, the user does not often expect the power generation using the solar panel 210. Accordingly, the notification controller 12 may perform the notification processing regarding the power generation amount if the front surface 1a faces the vertically upper side, and needs not perform the notification processing regarding the power generation amount if the front surface 1a does not face the vertically upper side.

Figure 12:
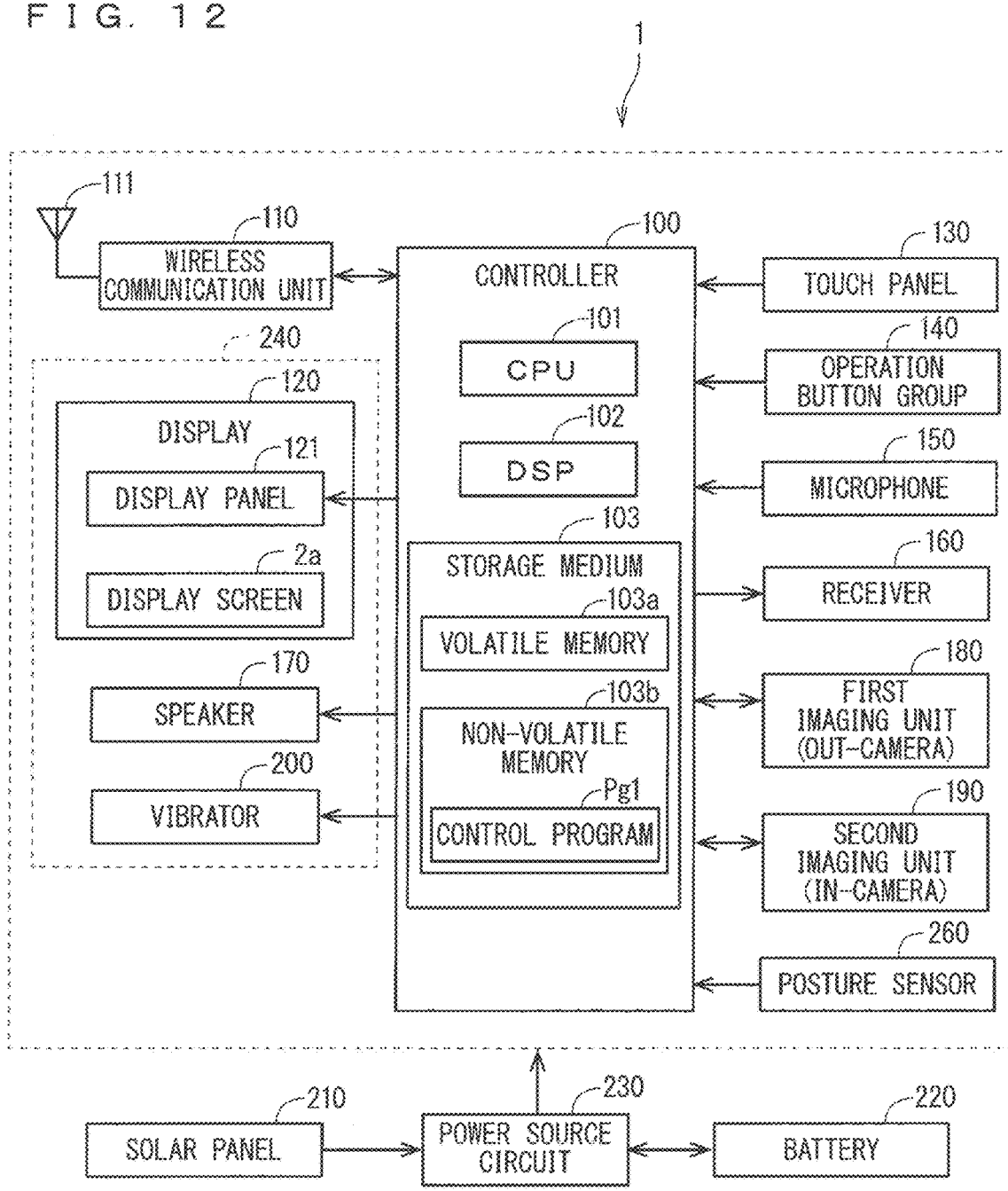
FIG. 12 A block diagram schematically showing one example of the electrical configuration of the mobile device.

FIG. 12 is a block diagram schematically showing another example of the electrical configuration of the mobile device 1. The mobile device 1 further comprises a posture sensor 260 compared to FIG. 3. The posture sensor 260 can detect that the front surface 1a of the mobile device 1 faces the vertically upper side. A state where the front surface 1a faces the vertically upper side herein also includes a state where the front surface 1a is inclined. In short, an arrow passing through the front surface 1a from the rear surface 1b as a base end to be parallel with a normal line of the front surface 1a needs to extend toward the vertically upper side relative to a horizontal surface.

Figure 13:
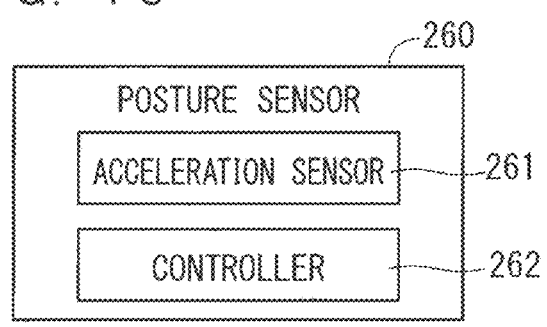
FIG. 13 A block diagram schematically showing one example of an internal configuration of a posture sensor.

FIG. 13 is a drawing showing one example of an internal configuration of the posture sensor 260. The posture sensor 260 includes an acceleration sensor 261 and a controller 262, for example. The acceleration sensor 261 can detect an acceleration rate in the mobile device 1, convert a value of the detected acceleration rate into an electrical signal, and output the electrical signal to the controller 262. For example, the acceleration sensor 261 can detect the acceleration rate based on an electrostatic capacitance system, a piezoresistance system, or a thermal detection system, for example. The acceleration sensor 261 detects an acceleration component of X, Y, Z axes substantially perpendicular to each other, for example.

The controller 262 detects a posture of the mobile device 1 based on the acceleration rate. Since a gravity acceleration always occurs along the vertically lower side, the controller 262 can determine whether or not the front surface 1a of the mobile device 1 faces the vertically upper side based on the acceleration rate. The posture of the front surface 1a facing the vertically upper side is also referred to as the upper side posture, and the posture of the front surface 1a facing the vertically lower side is also referred to as the lower side posture hereinafter. The state where the front surface 1a faces the vertically lower side herein also includes the state where the front surface 1a is inclined. In short, an arrow passing through the front surface 1a from the rear surface 1b as a base end to be parallel with a normal line of the front surface 1a needs to extend toward the vertically lower side relative to a horizontal surface.

The posture sensor 260 may have a gyro sensor instead of the acceleration sensor 261 or together with the acceleration sensor 261. The gyro sensor is a vibration gyro sensor, for example, and detects an angular speed according to a rotational movement of the mobile device 1. The gyro sensor converts a value of the detected angular speed into an electrical signal, and outputs the electrical signal to the controller 262. The controller 262 recognizes the value of the angular speed based on the electrical signal being input from the gyro sensor. The controller 262 can obtain a rotational angle of the mobile device 1 based on an integration of the angular speed. The controller 262 detects the posture of the mobile device 1 based on the rotational angle. Both the acceleration rate detected by the acceleration sensor 261 and the angular speed detected by the gyro sensor may be used to increase a detection accuracy.

A function of the controller 262 may be mounted on the controller 100. In this case, the detection values of the acceleration sensor 261 and the gyro sensor are output to the controller 100. If both the static sensor 250 and the posture sensor 260 are located, they may share one acceleration sensor and one gyro sensor.

The light volume determination unit 11 and the notification controller 12 execute the operation described above (the operation in FIG. 6 and FIG. 8) if the posture sensor 260 detects the upper side posture of the mobile device 1, and does not execute the operation described above if the posture sensor 260 does not detect the upper side posture of the mobile device 1.

According to this configuration, the notification described above can be performed when the notification regarding the power generation amount is highly necessary, that is to say, in a state where the power generation performed by the solar panel 210 is expected. In contrast, when the notification regarding the power generation amount is less necessary, the light volume determination unit 11 and the notification controller 12 do not operate, thus the power consumption can be reduced.

Figure 14:
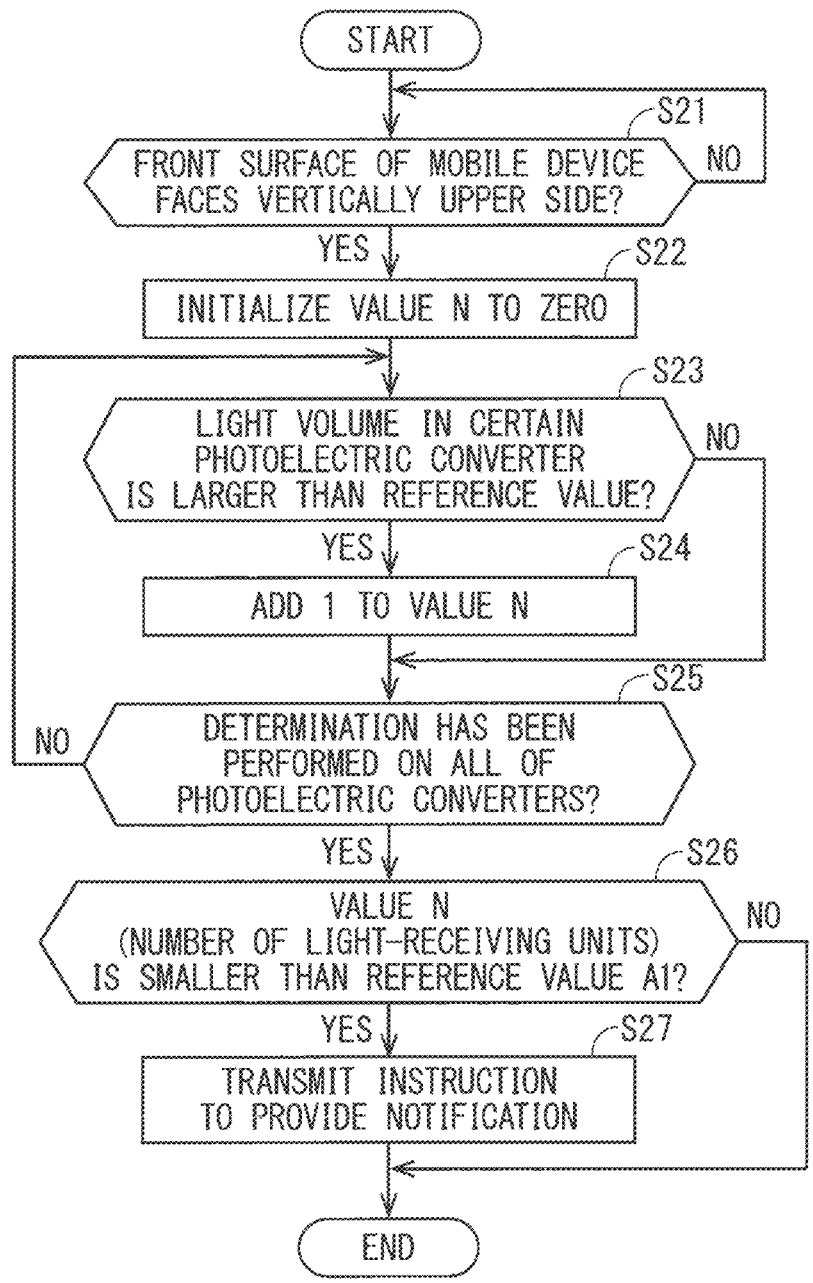
FIG. 14 A flow chart showing one example of the operation of the controller.

FIG. 14 is a flow chart illustrating one example of the operation described above of the controller 100. The controller 100 may execute a series of operations shown in FIG. 14 repeatedly. Firstly, in Step S21, the controller 100 determines whether or not the posture sensor 260 detects the upper side posture of the mobile device 1. If the controller 100 determines that the upper side posture is not detected, the controller 100 executes Step S21 again. That is to say, if the front surface 1a does not face the vertically upper side, the controller 100 does not execute the notification processing of Steps S22 to S27. In the meanwhile, if the controller 100 determines that the upper side posture of the mobile device 1 is detected, the controller 100 executes Step S22. Steps S22 to S27 are the same as Steps S12 to S17, respectively.

The controller 100 may execute Steps S22 to S27 if the mobile device 1 remains still and the front surface 1a faces the vertically upper side. In other words, the controller 100 needs not execute Steps S22 to S27 if the mobile device 1 spatially moves or the front surface 1a faces the vertically lower side. According to this configuration, the notification described above can be performed when the notification regarding the power generation amount is more necessary.

<4-1-3. Notification Level>

As the number of the photoelectric converters 211 which the strong light enters decreases, the power generation amount of the solar panel 210 becomes smaller. Thus, as the number of light-receiving units decreases, it is increasingly desired to move the mobile device 1 to make the light enter the wider range of the solar panel 210. Accordingly, the notification controller 12 may instruct the notification unit 240 to provide the notification at a higher notification level as the number of light-receiving units decreases.

For example, as the notification level becomes higher, a sound volume or a frequency of sound from the speaker 170 may be increased, or a vibration width or a frequency of vibration of the vibrator 200 may be increased. The notification level may be expressed by a color or a size of characters in the display panel 121. For example, a red color or a yellow color may be adopted when the notification level is high, and the other color (for example, a green color) may be adopted when the notification level is low. The display panel 121 may display a larger character when the notification level is high, for example. If the notification unit 240 has the light-emitting element, an amount of luminescence (luminance) of the light-emitting element may be increased or a cycle of blinking may be shortened as the notification level becomes higher.

The user can thereby learn of the power generation amount of the solar panel 210 in more detail.

Figure 15:
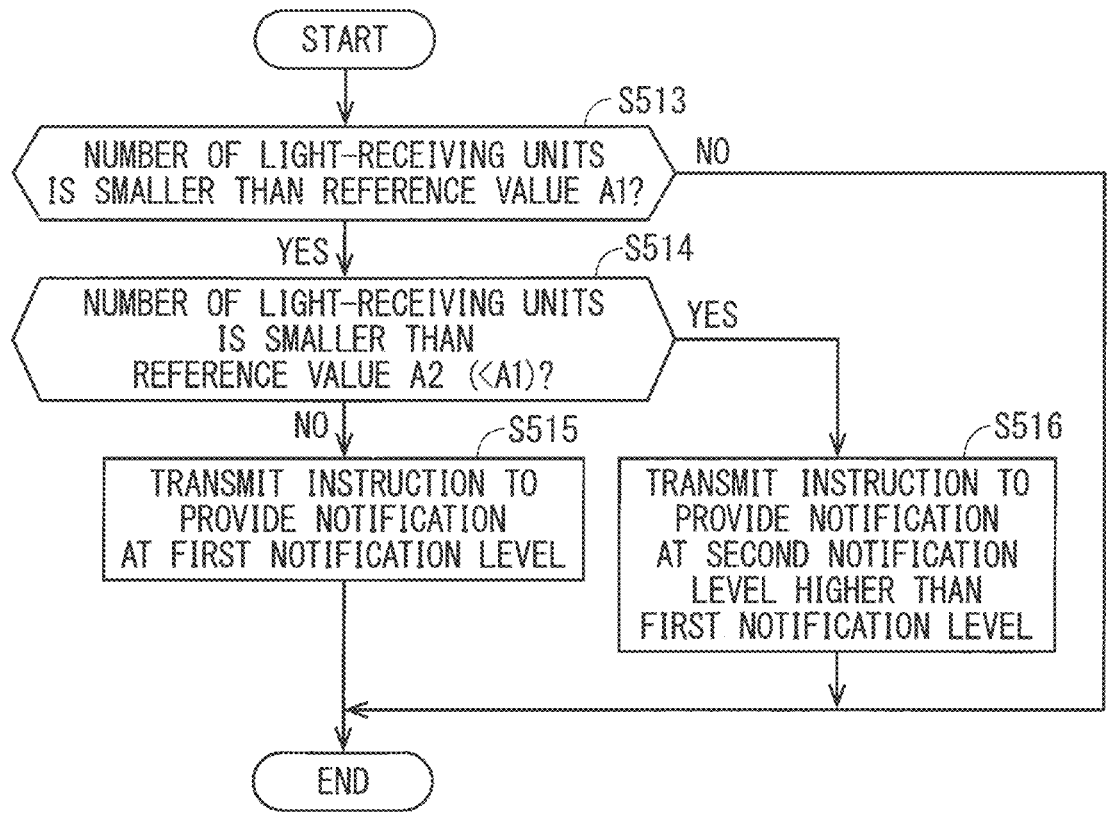
FIG. 15 A flow chart showing one example of the operation of the notification controller.

FIG. 15 is a flow chart illustrating one example of the operation described above of the notification controller 12. This flow chart corresponds to a specific example of Step S5 in FIG. 6. In Step S513, the notification controller 12 determines whether or not the number of the photoelectric converters 211 which the strong light enters is smaller than the reference value A1. If the notification controller 12 determines that the number of light-receiving units is larger than the reference value A1, the notification controller 12 finishes the processing. If the notification controller 12 determines that the number of light-receiving units is smaller than the reference value A1, the notification controller 12 determines whether or not the number of light-receiving units is smaller than a reference value A2 in Step S514. The reference value A2 is smaller than the reference value A1. The reference value A2 may be preset and stored in a storage medium, for example.

If the notification controller 12 determines that the number of light-receiving units is larger than the reference value A2, the notification controller 12 instructs the notification unit 240 to provide the notification at a first notification level in Step S515. The notification unit 240 provides the notification at the first notification level based on the instruction.

If the notification controller 12 determines that the number of light-receiving units is smaller than the reference value A2, the notification controller 12 instructs the notification unit 240 to provide the notification at a second notification level higher than the first notification level in Step S516. The notification unit 240 provides the notification at the second notification level based on the instruction.

<4-2. Notification for Drop Prevention>

The solar panel 210 may have a size large enough to occupy a great part of the front surface 1a of the mobile device 1 (also refer to FIG. 4). In other words, the solar panel 210 may have an area extending from an upper-side end portion to a lower-side end portion and from a left-side end portion to a right-side end portion of the mobile device 1. The solar panel 210 can thereby receive the light in the wider range, and the power generation amount can be increased.

Figure 16:
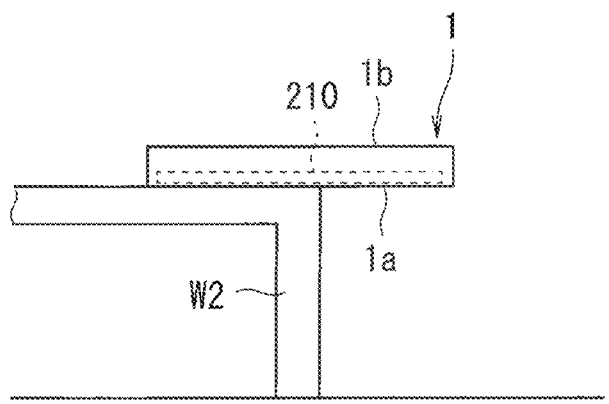
FIG. 16 A drawing schematically showing one example of a state where the mobile device is disposed.

The user puts the mobile device 1 on a predetermined mounting surface with the front surface 1a facing the vertically lower side (that is to say, in the lower side posture) in some cases. The mounting surface is an upper surface of a mounting member such as a desk or a board, for example. At this time, if a part of the mobile device 1 is protruded from the mounting surface, the mobile device 1 may drop from the mounting member. FIG. 16 is a drawing schematically showing one example of a state where the mobile device 1 is disposed on the mounting member with the part of the mobile device 1 being protruded. In such a state, the mobile device 1 easily drops from a mounting member W2.

In this state, the light is blocked by the mounting member W2 in a part of the solar panel 210 facing the mounting surface, so that the light hardly enters. In the meanwhile, the light may enter the part of the solar panel 210 protruded from the mounting surface. In other words, the strong light may enter the photoelectric converter 211 located outside the mounting surface. As a protruded part of the mobile device 1 becomes larger, the number of the photoelectric converters 211 which the light enters increases, and a possibility of the dropping of the mobile device 1 increases.

Thus, the notification controller 12 may perform the notification for a drop prevention described below instead of the notification regarding the power generation amount described above. That is to say, the notification controller 12 may instruct the notification unit 240 to provide the notification if the number of the photoelectric converters 211 which the strong light enters is larger than a reference value B1. The user can thereby recognize the possibility of the dropping of the mobile device 1.

Figure 17:
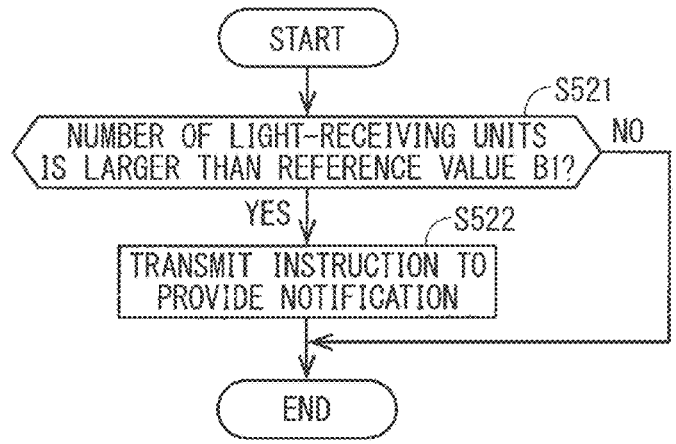
FIG. 17 A flow chart showing one example of the operation of the notification controller.

FIG. 17 is a flow chart illustrating one example of the operation described above of the notification controller 12. This flow chart corresponds to a specific example of Step S5 in FIG. 6. Firstly, in Step S521, the notification controller 12 determines whether or not the number of the photoelectric converters 211 which the strong light enters is larger than the reference value B1. The reference value B1 may be preset and stored in a storage medium, for example. The reference value B1 may be different from or the same as the reference value A1. If the notification controller 12 determines that the number of light-receiving units is smaller than the reference value B1, the notification controller 12 finishes the processing. If the notification controller 12 determines that the number of light-receiving units is larger than the reference value B1, the notification controller 12 instructs the notification unit 240 to provide the notification in Step S522. The notification unit 240 provides the notification based on the instruction.

<4-2-1. Posture of Mobile Device>

As described above, the notification for the drop prevention is based on an assumption that the front surface 1a faces the vertically lower side. Thus, the controller 100 may perform the notification processing for the drop prevention (the processing in FIG. 6 and FIG. 17) if the front surface 1a faces the vertically lower side, and needs not perform the notification processing for the drop prevention if the front surface 1a does not face the vertically lower side. That is to say, if the front surface 1a does not face the vertically lower side, the notification processing for the drop prevention is not performed by reason that an assumed state is different.

The posture sensor 260 shown in FIG. 12 detects the posture of the mobile device 1. That is to say, the controller 100 performs the notification processing for the drop prevention if the controller 100 determines that the posture sensor 260 detects the lower side posture, and does not perform the notification processing for the drop prevention if the controller 100 determines that the posture sensor 260 does not detect the lower side posture.

According to this configuration, the notification for the drop prevention can be performed in a state where the notification for the drop prevention is necessary. In contrast, the light volume determination unit 11 and the notification controller 12 need not operate in a state where the notification for the drop prevention is not necessary. If the light volume determination unit 11 and the notification controller 12 do not operate, the power consumption can be reduced.

Figure 18:
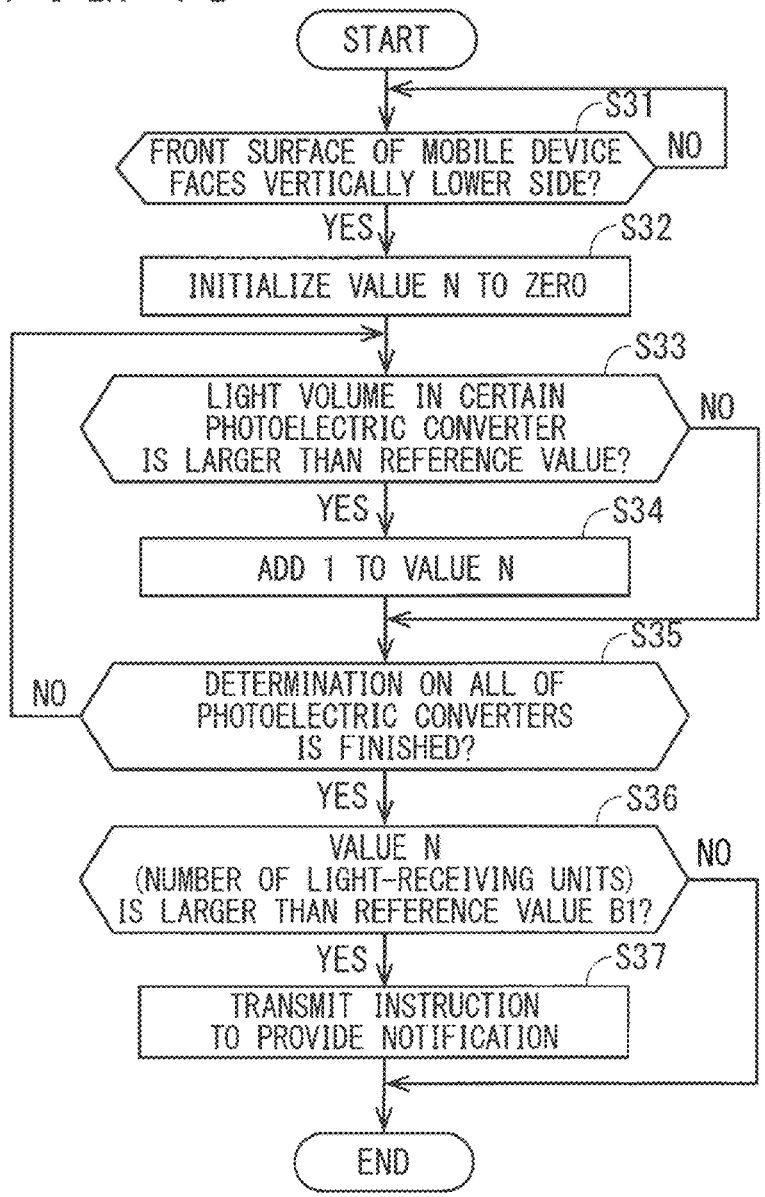
FIG. 18 A flow chart showing one example of the operation of the controller.

FIG. 18 is a flow chart illustrating one example of the operation described above of the controller 100. In Step S31, the controller 100 determines whether or not the posture sensor 260 detects the lower side posture of the mobile device 1. If the controller 100 determines that the lower side posture of the mobile device 1 is not detected, the controller 100 executes Step S31 again. That is to say, if the front surface 1a does not face the vertically lower side, the controller 100 does not execute the notification processing of Steps S32 to S37. In the meanwhile, if the controller 100 determines that the front surface 1a faces the vertically lower side, the controller 100 executes Step S32. Steps S32 to S37 are the same as Steps S1 to S4, S521, and S522, respectively.

<4-2-2. Spatial Movement of Mobile Device>

If the mobile device 1 is disposed on the mounting member W2 with the front surface 1a facing the mounting surface, the user may accidentally push the mobile device 1 and drops the mobile device 1 from an edge of the mounting surface. In this case, the mobile device 1 drops with a movement on the mounting surface. That is to say, there is also a case where the notification is necessary during the movement of the mobile device 1. Thus, the spatially static state of the mobile device 1 needs not be adopted as a condition of the notification for the drop prevention. That is to say, the controller 100 may execute the notification processing for the drop prevention regardless of the detection result of the static sensor 250.

In this movement, the mobile device 1 does not move in a normal line direction of the front surface 1a. Thus, a state where the movement along the normal line direction of the front surface 1a of the mobile device 1 is not performed may be adopted as the condition described above. For example, the static sensor 250 in FIG. 9 can detect the static state of the mobile device 1 along the normal line direction. For example, the controller 252 determines that the movement of the mobile device 1 along the normal line direction is not performed if an acceleration rate of the mobile device 1 along the normal line direction is smaller than a first predetermined value over a predetermined period of time. That is to say, the static sensor 250 detects the static state of the mobile device 1 along the normal line direction.

The controller 100 may perform the notification processing for the drop prevention if the front surface 1a faces the vertically lower side and the mobile device 1 remains still along the normal line direction. In other words, the controller 100 needs not perform the notification processing for the drop prevention if the front surface 1a does not face the vertically lower side or the mobile device 1 also moves in the normal line direction.

<4-2-3. Notification Level>

As described above, the mobile device 1 drops from the mounting member more easily as the protruded part of the mobile device 1 becomes larger, that is to say, as the number of the photoelectric converters 211 which the strong light enters increases. Thus, the notification controller 12 may instruct the notification unit 240 to provide the notification at a higher notification level as the number of light-receiving units increases.

Figure 19:
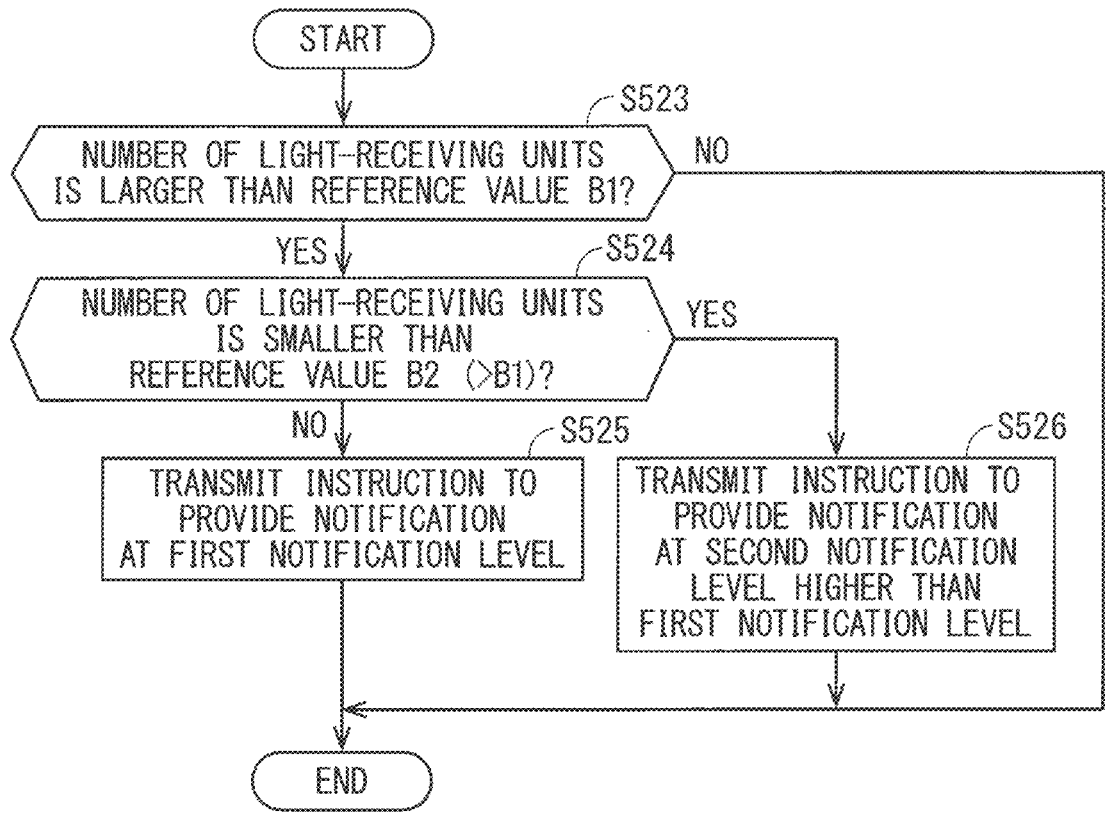
FIG. 19 A flow chart showing one example of the operation of the notification controller.

FIG. 19 is a flow chart illustrating one example of the operation described above of the notification controller 12. This flow chart corresponds to one example of Step S5 in FIG. 6. In Step S523, the notification controller 12 determines whether or not the number of the photoelectric converters 211 which the strong light enters is larger than the reference value B1. If the notification controller 12 determines that the number of light-receiving units is smaller than the reference value B1, the notification controller 12 finishes the processing. If the notification controller 12 determines that the number of light-receiving units is larger than the reference value B1, the notification controller 12 determines whether or not the number of the light-receiving units is larger than a reference value B2 in Step S524. The reference value B2 is larger than the reference value B1. The reference value B2 may be preset and stored in a storage medium, for example. The reference value B2 may be different from the reference values A1 and A2, or may be the same as one of the reference values A1 and A2.

If the notification controller 12 determines that the number of light-receiving units is smaller than the reference value B2, the notification controller 12 instructs the notification unit 240 to provide the notification at a first notification level in Step S525. The notification unit 240 provides the notification at the first notification level based on the instruction. If the notification controller 12 determines that the number of light-receiving units is larger than the reference value B2, the notification controller 12 instructs the notification unit 240 to provide the notification at a second notification level higher than the first notification level in Step S526. The notification unit 240 provides the notification at the second notification level based on the instruction.

<4-2-4. Notification Unit>

In a case where a part of the mobile device 1 is protruded from the mounting surface, if the mobile device 1 vibrates, the mobile device 1 may drop from the mounting member due to the vibration. Thus, the notification controller 12 may instruct the notification unit 240 other than the vibrator 200 (for example, the speaker 170 or the display 120) to provide the notification in the notification for the drop prevention. According to this configuration, the dropping due to the vibration can be suppressed.

Figure 20:
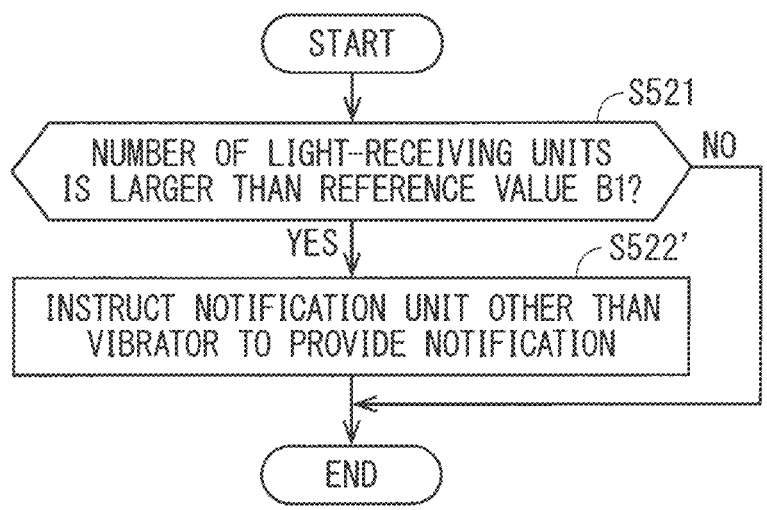
FIG. 20 A flow chart showing one example of the operation of the notification controller.

FIG. 20 is a flow chart illustrating one example of the operation described above of the notification controller 12. The notification controller 12 executes Step S522' instead of Step S522 compared to FIG. 17. The notification controller 12 instructs the notification unit 240 other than the vibrator 200 to provide the notification in Step S522'.

If the front surface 1a faces the vertically lower side, it is hard for the user to see the display screen 2a, thus the notification controller 12 may instruct the notification unit 240 other than the display 120 to provide the notification.

Located in the rear surface 1b is a light-emitting element in some cases. This light-emitting element is located to illuminate an object whose image is taken with the first imaging unit 180, for example. If the mobile device 1 is disposed on the mounting member with the front surface 1a facing the vertically lower side, the user can visually recognize the light-emitting element easily. Thus, if the front surface 1a faces the vertically lower side, the notification controller 12 may make the light-emitting element located in the rear surface 1b emit the light.

<4-2-5. Light Volume Reference Value>

If only an edge of the mobile device 1 is located outside the mounting member W2, there is less possibility of the dropping of the mobile device 1. That is to say, only the photoelectric converter 211 located on the edge of the solar panel 210 is irradiated with the light, there is less possibility of the dropping. In the meanwhile, if the protruded part of the mobile device 1 increases, the photoelectric converter 211 located in a center of the solar panel 210 is also located outside the mounting member W2. Thereby, the light also enters the photoelectric converter 211 located in the center. In a state where the light also enters the photoelectric converter 211 located in the center as described above, there is a high possibility of the dropping.

Figure 21:
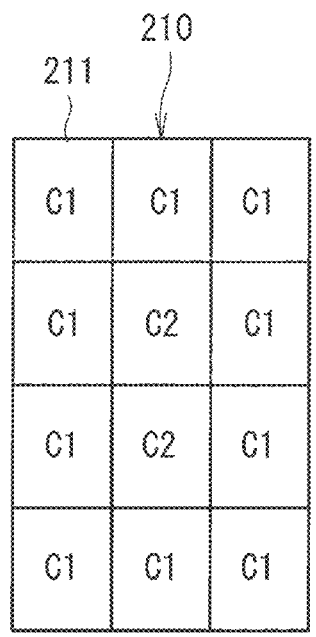
FIG. 21 A drawing schematically showing one example of light volume reference values being set in each of photoelectric converters.

Thus, the light volume reference value regarding the photoelectric converter 211 located in the center may be set smaller than the light volume reference value regarding the photoelectric converter 211 located on the edge. FIG. 21 schematically shows one example of light volume reference values being set in each of the photoelectric converters 211. In the illustration in FIG. 21, the light volume reference values being set in each of the photoelectric converter 211 are indicated as light volume reference values C1 and C2. As shown in FIG. 21, the light volume reference value C1 is set to the photoelectric converter 211 located on the edge of the solar panel 210, and the light volume reference value C2 is set to the photoelectric converter 211 located in the center of the solar panel 210. The light volume reference value C2 is set smaller than the light volume reference value C1.

According to this configuration, it is determined that the strong light enters the photoelectric converter 211 located in the center with a smaller light volume. Thus, the notification for the drop prevention is easily performed when the photoelectric converter 211 located in the center is located outside the mounting member W2. Accordingly, the notification for the drop prevention is easily performed when there is a high possibility of drop prevention.

<4-3. Execution of both Notification Regarding Power Generation Amount and Notification for Drop Prevention>

The notification controller 12 may perform both the notification regarding the power generation amount and the notification regarding the drop prevention. For example, the notification controller 12 may perform the notification processing regarding the power generation amount if the posture sensor 260 detects the upper side posture, and perform the notification processing for the drop prevention if the posture sensor 260 detects the lower side posture. According to this configuration, the notification regarding the power generation amount can be performed when the notification regarding the power generation amount is highly necessary, and the notification for the drop prevention can be performed when the notification for the drop prevention is highly necessary.

If both the notification regarding the power generation amount and the notification for the drop prevention are performed, the operations of each item described above can be obviously performed in combination with each other. For example, the controller 100 may perform the notification processing regarding the power generation amount under a condition that the static sensor 250 detects the static state of the mobile device 1, and perform the notification processing regarding the drop prevention regardless of the detection result of the static sensor 250.

<4-3-1. Notification Form>

If the notification controller 12 performs both the notification regarding the power generation amount and the notification for the drop prevention, the notification controller 12 may perform those notifications in forms different from each other. That is to say, the notification controller 12 may instruct the notification unit 240 to provide the notification in a first notification form in the notification regarding the power generation amount, and instruct the notification unit 240 to provide the notification in a second notification form different from the first notification form in the notification for the drop prevention. The notification form herein includes contents of a display screen displayed on the display panel 121, a type of a sound being output from the speaker 170 (a volume, a pitch, a melody, a pattern of a machine sound, and contents of voice), and a vibration form of the vibrator 200 (a vibration width, a frequency of vibration, and a pattern of vibration).

For example, if the front surface 1a faces the vertically upper side and the number of the photoelectric converters 211 which the strong light enters is smaller than the reference value A1, the notification controller 12 makes the speaker 170 output a first melody as the notification regarding the power generation amount. In the meanwhile, if the front surface 1a faces the vertically lower side and the number of the photoelectric converters 211 which the strong light enters is larger than the reference value B1, the notification controller 12 makes the speaker 170 output a second melody different from the first melody as the notification for the drop prevention.

Accordingly, the user easily distinguishes the notification regarding the power generation amount from the notification for the drop prevention. Thus, the user can take a necessary measure more rapidly. Specifically, the user can rapidly put the mobile device 1 in a well-light region in response to the notification regarding the power generation amount, and can rapidly move the mobile device 1 to suppress the dropping of the mobile device 1 in response to the notification for the drop prevention.

<5. Solar Panel>

In the example described above, the solar panel 210 is disposed on the front surface 1a side. However, the solar panel 210 may be disposed on the rear surface 1b side of the mobile device 1. In the illustration in FIG. 1, the display is not located on the rear surface 1b side, thus the solar panel 210 needs not have transparency. In this case, the photoelectric converter 211 may be a silicon semiconductor solar cell, for example.

Figure 22:
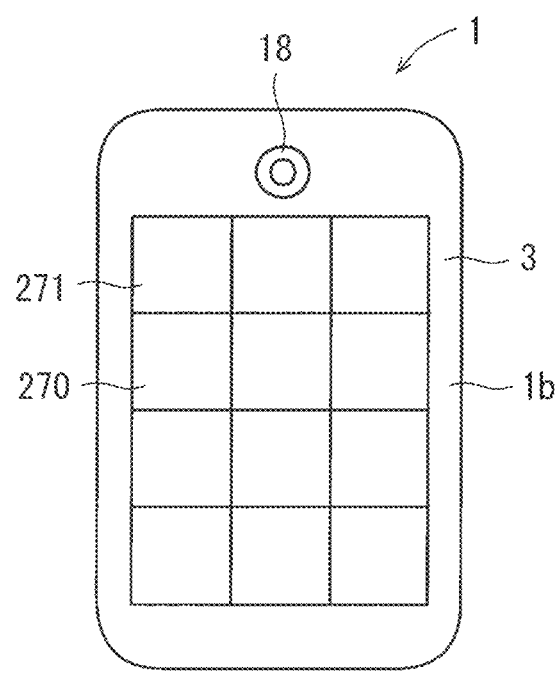
FIG. 22 A rear view schematically showing one example of the external appearance of the mobile device.

The solar panel 210 and a solar panel 270 may be disposed on the front surface 1a side and the rear surface 1b side of the mobile device 1, respectively. The solar panel 270 generates electrical power in accordance with the light entering from the rear surface 1b located on an opposite side of the front surface 1a. FIG. 22 is a rear view schematically showing one example of the external appearance of the mobile device 1. The solar panel 270 has a configuration similar to the solar panel 210. That is to say, the solar panel 270 is also formed of a plurality of photoelectric converters 271 disposed side by side.

An output of each photoelectric converter 271 is input to the power source circuit 230. The power source circuit 230 uses the electrical power generated by the solar panel 270 as a power source of the mobile device 1. For example, the power source circuit 230 detects the output of each photoelectric converter 271 as a parameter indicating a light volume of each photoelectric converter 271, and outputs the output thereof to the controller 100.

Figure 23:
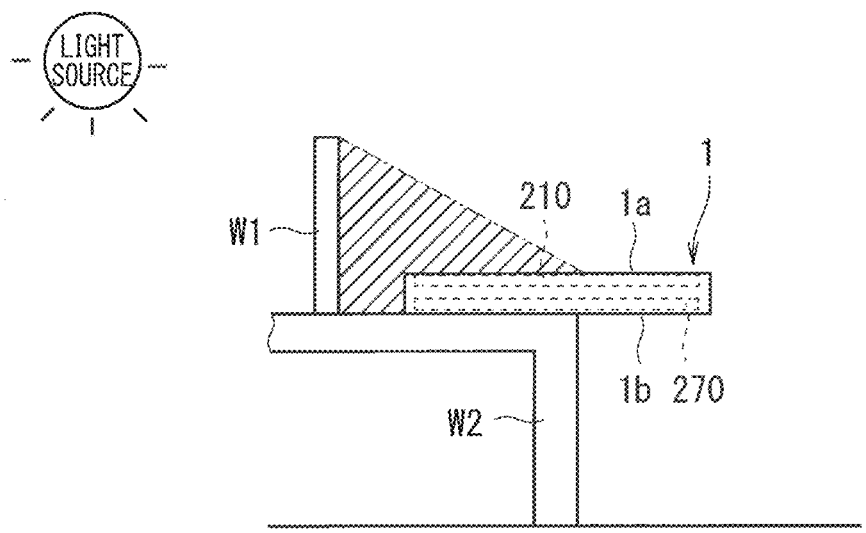
FIG. 23 A drawing schematically showing one example of a state where the mobile device is disposed.

Considered is a case where the user puts the mobile device 1 on the mounting member with the front surface 1*a* of the mobile device 1 facing the vertically upper side. FIG. 23 is a drawing schematically showing one example of a state where the mobile device 1 is disposed. In the illustration in FIG. 23, the mobile device 1 is disposed on the mounting member W2 with the front surface 1*a* facing the vertically upper side (that is to say, in the upper side posture). In this state, the user often expects the power generation performed by the solar panel 210. In the illustration in FIG. 23, the object W1 is also disposed on the mounting member W2, and part of the light from the light source is blocked by the object W1, so that the other part of the light enters a part of the solar panel 210. In the illustration in FIG. 23, a region where the light from the light source is blocked by the object W1 is indicated by a diagonal hatching. The user moves the mobile device 1 to a position close to the light source across the object W1, thereby being able to make the light enter the wider range of the solar panel 210.

In the meanwhile, the rear surface 1*b* faces the vertically lower side in this state, thus the user does not normally expect the power generation performed by the solar panel 270. The reason is that the light entering the solar panel 270 is blocked by the mounting member W2.

On the other hand, it can be determined whether or not there is a high possibility of the dropping of the mobile device 1 in accordance with how the light enters the solar panel 270. As described already, it can be determined that there is the high possibility of the dropping of the mobile device 1 when the number of photoelectric converters which the strong light enters is larger than the reference value B2 in the solar panel 270.

Thus, if the controller 100 determines that the posture sensor 260 detects the upper side posture, the controller 100 may perform the notification processing regarding the power generation amount using the solar panel 210, and perform the notification processing for the drop prevention using the solar panel 270. If the controller 100 determines that the posture sensor 260 detects the lower side posture, the controller 100 may perform the notification processing regarding the power generation amount and the notification processing for the drop prevention using the solar panels opposite to those described above. That is to say, the controller 100 may perform the notification processing regarding the power generation amount using the solar panel 270, and perform the notification processing for the drop prevention using the solar panel 210.

Figure 24:
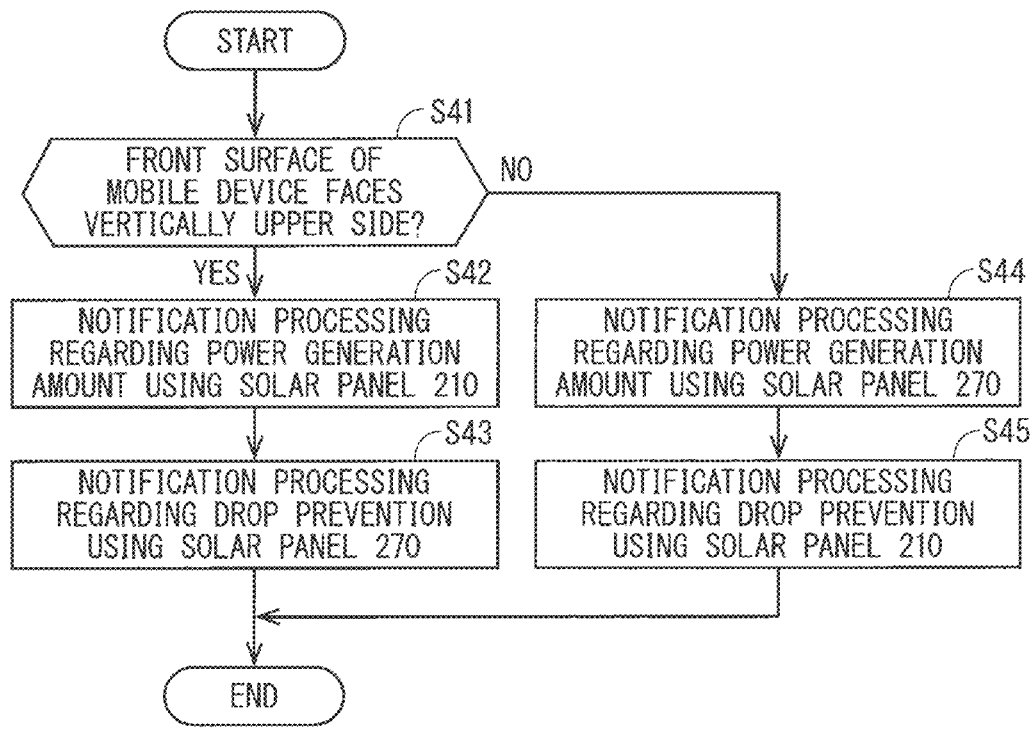
FIG. 24 A flow chart showing one example of the operation of the notification controller.

FIG. 24 is a flow chart illustrating one example of the operation described above of the controller 100. Firstly, in Step S41, the controller 100 determines whether or not the posture sensor 260 detects the upper side posture. If the controller 100 determines that the posture sensor 260 detects the upper side posture, the controller 100 performs the notification processing regarding the power generation amount using the solar panel 210 in Step S42. For example, the controller 100 executes the operation appropriately indicated by FIGS. 6, 8, 11, 14, and 15 using the solar panel 210. Next, the controller 100 performs the notification processing for the drop prevention using the solar panel 270 in Step S43. The controller 100 executes the operation appropriately indicated by FIGS. 6 and 17 to 20, for example, using the solar panel 270.

If the controller 100 determines that the posture sensor 260 does not detect the upper side posture, that is to say, that the posture sensor 260 detects the lower side posture in Step S41, the controller 100 performs the notification processing regarding the power generation amount using the solar panel 270 in Step S44. Next, the controller 100 performs the notification processing for the drop prevention using the solar panel 210 in Step S45.

An order of executing Steps S42 and S43 may be reversed, or Steps S42 and S43 may be parallelly executed. The same applies to Steps S44 and S45.

The number of photoelectric converters belonging to each of the solar panels 210 and 270 may be different from each other. Thus, the reference value A1 may be different from each other in the solar panels 210 and 270. The same applies to the reference values A2, B1, and B2.

<6. Notification Unit>

Figure 25:
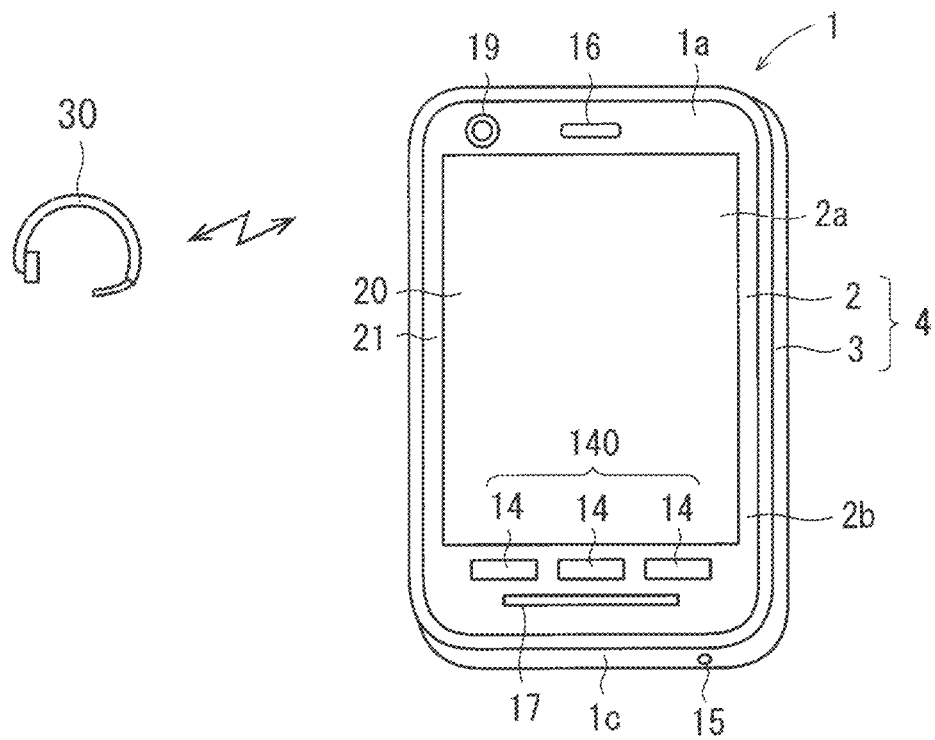
FIG. 25 A diagram schematically showing one example of a configuration of a mobile device system.

In the example described above, the notification controller 12 instructs the notification unit 240 mounted on the mobile device 1 to provide the notification. However, the configuration of the present mobile device 1 is not limited thereto. A notification unit located in another device different from the mobile device 1 may be used. FIG. 25 is a diagram schematically showing one example of a configuration of a mobile device system. The mobile device system comprises the mobile device 1 and a device 30. The mobile device 1 and the device 30 can perform a wired or wireless communication with each other. In the illustration in FIG. 25, the mobile device 1 and the device 30 perform the wireless communication.

The device 30 is a wearable device attached to the user, for example, and is a headphone in the illustration in FIG. 25. The headphone sandwiches a head with being in direct contact with both ears to be attached to the user. A device attached to an ear, a head, an arm, a finger, or a cloth, for example, can be adopted as well as the headphone as the wearable device 30. Specifically, the device 30 may be an earphone attached to an ear, a glasses-type device hung on both ears, a wristband type device worn on an arm, or a ring-type device worn on a finger, for example. The device 30 is not limited to the wearable device, but may be a desktop type device, for example.

Figure 26:
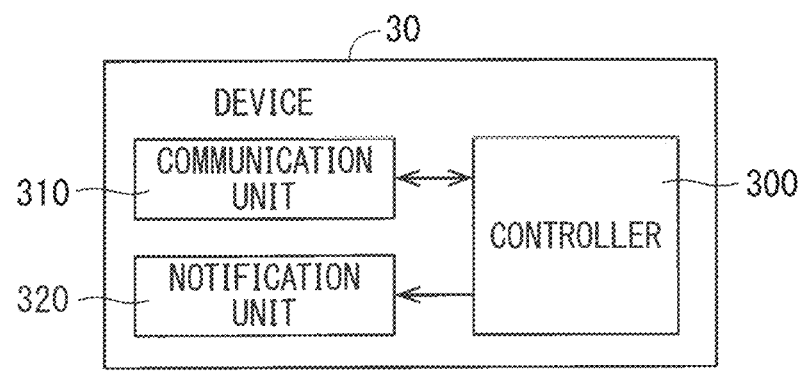
FIG. 26 A block diagram schematically showing one example of an internal configuration of a device.

FIG. 26 is a block diagram schematically showing one example of an electrical configuration of the device 30. The device 30 includes a communication unit 310, a controller 300, and a notification unit 320. The communication unit (communication circuit) 310 is a communication interface, for example, and can transmit/receive a signal to/from the mobile device 1. In the mobile device 1, the wireless communication unit 110 may communicate with the device 30, or it is also applicable that a communication unit different from the wireless communication unit 110 is located and this communication unit communicates with the device 30. The communication unit 310 may communicate with the mobile device 1 via near field communication, for example. Bluetooth (registered trademark), for example, can be adopted as the near field communication.

The notification unit 320 can provide the user of the notification under control of the controller 300. The device

30 is the headphone in the illustration in FIG. 25, thus the notification unit 320 includes a sound output unit. The sound output unit is a receiver, for example, and outputs a sound based on a sound signal from the controller 300.

The notification unit 320 may comprise at least one of the display, the light-emitting element, and the vibrator instead of or together with the sound output unit. The display is a liquid crystal panel or an organic EL panel, for example, and performs a display based on a display signal from the controller 300. The light-emitting element is a light-emitting diode, for example, and emits light based on a signal from the controller 300. The vibrator is an eccentric motor, a linear motor, or a piezoelectric vibration element, for example, and vibrates based on a signal from the controller 300. This vibration is transmitted to an outer package of the device 30.

The notification controller 12 of the mobile device 1 transmits the instruction on the notification to the device 30. The controller 300 receives the instruction via the communication unit 310, and instructs the notification unit 300 to provide the notification in accordance with the instruction. Accordingly, it is possible to make the notification unit 320 perform the notification described above in accordance with the number of the photoelectric converters 211 which the strong light enters.

Also according to this configuration, the user recognize to what degree of range the light enters in the solar panel based on the notification from the notification unit 320.

<7. Placement Form of Photoelectric Converter>

In the illustration in FIG. 4, the twelve photoelectric converters 211, four arranged longitudinally and three arranged laterally, are disposed. This structure includes the photoelectric converter 211 surrounded by another photoelectric converter 211 and the photoelectric converter 211 located on the edge of the solar panel 210. The photoelectric converter 211 located on the edge forms a part of an end surface of the solar panel 210. An output line of such a photoelectric converter 211 located on the edge can be easily led out from an end surface which is not in contact with another the photoelectric converter 211. For example, the output line of the photoelectric converter 211 forming a part of the left edge of the solar panel 210 can be easily led out from a left end surface. In the meanwhile, the photoelectric converter 211 located in the center is surrounded by the other photoelectric converters, so that it is hard to lead out an output line from an end surface of the photoelectric converter 211 located in the center. Thus, the output line of the photoelectric converter 211 located in the center may be led out in the normal line direction of the solar panel 210 and then drawn in a surface parallel to the solar panel 210.

Figure 27:
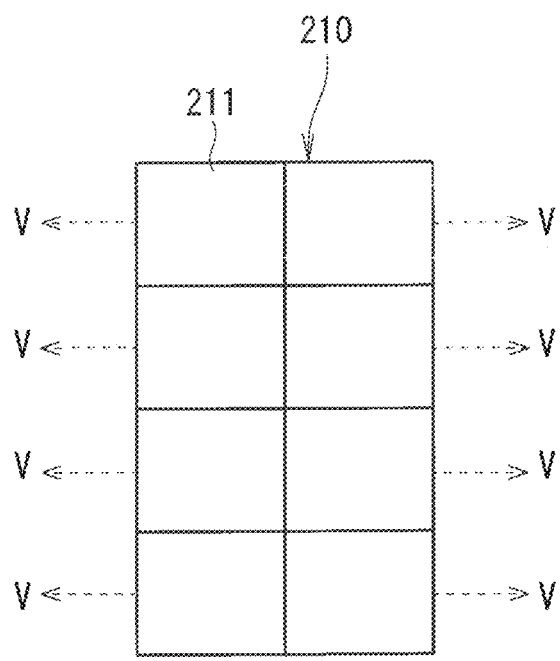
FIG. 27 A drawing schematically showing one example of the configuration of the solar panel.

However, in this case, the output line of photoelectric converter 211 located in the center is routed on a back surface side, for example, of the photoelectric converter 211 located on the edge. A size of the mobile device 1 in the normal line direction may be thereby increased. Thus, as illustrated in FIG. 27, the solar panel 210 may be formed of only the photoelectric converters 211 located on the edge. For example, only the two photoelectric converters 211 are arranged along one of a longitudinal direction and a lateral direction of the solar panel 210, and the plurality of the photoelectric converters 211 are arranged along the other one of the directions. That is to say, the 2M (M is a natural number) photoelectric converters 211 may be arranged in a lattice pattern, two arranged longitudinally and M arranged laterally or M arranged longitudinally and two arranged laterally.

According to this configuration, the output lines of all of the photoelectric converters 211 can be led out from the end surface of each photoelectric converter 211. The same applies to the photoelectric converter 271.

<Notification Condition>

The controller 100 may transmit the instruction to provide the notification based on not only the number of light-receiving units but the number of light-receiving units and a magnitude relationship of the light volume between the photoelectric converters located in a predetermined position. For example, the controller 100 may transmit the instruction to provide the notification for the drop prevention if the number of photoelectric converters whose light volume is determined to be large (a first number of light-receiving units) is larger than a first reference value and the light volume of the photoelectric converter 211 located in the center of the solar panel 210 is determined to be large. In other words, the controller 100 needs not transmit the instruction to provide the notification for the drop prevention if it is not determined that the light volume of the photoelectric convert 211 located in the center is large even in the case where the first number of light-receiving units is larger than the first reference value. In a case where there are the plurality of the photoelectric converters 211 located in the center, the controller 100 may transmit the instruction to provide the notification for the drop prevention if it is determined that the light volume of at least one of the photoelectric converters 211 located in the center is large. The controller 100 may transmit the instruction to provide the notification regarding the power generation amount if the first number of light-receiving units is smaller than a second reference value and it is determined that the light volume of at least one of the photoelectric converters 211 located on the edge of the solar panel 210 is small.

Furthermore, the controller 100 may transmit the instruction to provide the notification based on a magnitude relationship of the light volume of the photoelectric converters located in a predetermined position regardless of the number of light-receiving units. For example, the controller 100 may transmit the instruction to provide the notification for the drop prevention if the light volume of the photoelectric converter 211 located in the center of the solar panel 210 is determined to be large. In the case where there are the plurality of the photoelectric converters 211 located in the center, the controller 100 may transmit the instruction to provide the notification for the drop prevention if it is determined that the light volume of at least one of the photoelectric converters 211 located in the center is large. The controller 100 may transmit the instruction to provide the notification regarding the power generation amount if it is determined that the light volume of at least one of the photoelectric converters 211 located on the edge of the solar panel 210 is small.

While the mobile device, the method for controlling the mobile device, and the non-transitory storage medium have been described above in detail, the above description is in all aspects illustrative and not restrictive. The various modifications described above are applicable in combination as long as they are not mutually inconsistent. It is understood that numerous modifications which have not been exemplified can be devised without departing from the scope of the present disclosure.

The invention claimed is:
1. A mobile device, comprising:
an outer package;
a first solar panel including a plurality of first photoelectric converters configured to generate electrical power based on light which enters from a first surface of the outer package and being disposed side by side; and at least one processor configured to determine a magnitude of a light volume of light entering the first solar panel for each of the plurality of first photoelectric converters, determine a first number of light-receiving units which is a total number of first photoelectric converters among the plurality of first photoelectric converters receiving a first light volume, the first light volume determined to be larger than a first predetermined value, and execute notification processing of transmitting an instruction to provide a notification based on the first number of light-receiving units, wherein the at least one processor is configured to, in response to determining the first number of light-receiving units being less than a reference value, transmit the instruction to provide the notification.

2. The mobile device according to claim 1, further comprising a posture sensor configured to detect a posture of the mobile device, wherein the at least one processor is configured to execute further notification processing upon determining that the first surface faces a vertically upper side.

3. The mobile device according to claim 1, further comprising a static sensor configured to detect whether or not the mobile device spatially remains still, wherein the at least one processor is configured to execute further notification processing upon determining that the mobile device remains still.

4. The mobile device according to claim 1, wherein the at least one processor is configured to transmit the instruction to provide the notification upon determining that the first number of light-receiving units is larger than a first reference value.

5. The mobile device according to claim 4, further comprising a posture sensor configured to detect a posture of the mobile device, wherein the at least one processor is configured to transmit the instruction to provide the notification upon determining that the first surface faces a vertically lower side and the first number of light-receiving units is larger than the first reference value, as first processing.

6. The mobile device according to claim 5, wherein the at least one processor is configured to transmit the instruction to provide the notification upon determining that the first surface faces a vertically upper side and the first number of light-receiving units is smaller than a second reference value, as second processing.

7. The mobile device according to claim 6, wherein the at least one processor is configured to transmit, in the second processing, the instruction to provide the notification in a notification form different from a notification form in the first processing.

8. The mobile device according to claim 6, further comprising a static sensor configured to detect whether or not the mobile device spatially remains still, wherein the at least one processor is configured to execute:

the first processing in response to the static sensor detecting a static state of the mobile device, and the second processing regardless of a detection result of the static sensor.

9. The mobile device according to claim 1, wherein the at least one processor is configured to transmit the instruction to provide the notification at a notification level according to the first number of light-receiving units.

10. The mobile device according to claim 1, further comprising a second solar panel including a plurality of second photoelectric converters configured to generate the electrical power based on light which enters from a second surface located on an opposite side of the first surface of the outer package and being disposed side by side.

11. The mobile device according to claim 10, further comprising a posture sensor configured to detect a posture of the mobile device, wherein the at least one processor is configured to determine a magnitude of a light volume of light entering the second solar panel for each of the plurality of second photoelectric converters, and determine a second number of light-receiving units which is a total number of second photoelectric converters among the plurality of second photoelectric converters receiving a second light volume, the second light volume determined to be larger than the first predetermined value, the at least one processor is configured to, in response to determining that the first surface faces a vertically upper side, transmit the instruction to provide the notification upon determining that the first number of light-receiving units is smaller than a first reference value, or transmit further instruction to provide the notification in response to determining that the second number of light-receiving units is larger than a second reference value, and the at least one processor is configured to, in response to determining that the first surface faces a vertically lower side, transmit the further instruction to provide the notification upon determining that the second number of light-receiving units is smaller than the first reference value, and transmit the instruction to provide the notification upon determining that the first number of light-receiving units is larger than the second reference value.

12. The mobile device according to claim 1, wherein the plurality of the first photoelectric converters includes 2M (M is a natural number) first photoelectric converters, and is arranged in a lattice pattern, two arranged longitudinally and M arranged laterally, or M arranged longitudinally and two arranged laterally.

13. The mobile device according to claim 1, wherein the at least one processor is configured to, in response to determining the first number of light-receiving units being zero, not transmit the instruction to provide the notification.

14. A method for controlling a mobile device, the method comprising:

determining a magnitude of a light volume of light entering a first solar panel, which includes a plurality of first photoelectric converters, for each of the plurality of the first photoelectric converters, the plurality of first photoelectric converters configured to generate electrical power based on light entering from a first surface of an outer package of a mobile device and being disposed side by side;

determining a first number of light-receiving units which is a total number of first photoelectric converters among the plurality of first photoelectric converters receiving a first light volume, the first light volume determined to be larger than a first predetermined value; and executing notification processing of transmitting an instruction to provide a notification based on the first number of light-receiving units, wherein said executing comprises in response to determining the first number of light-receiving units being less than a reference value, transmitting the instruction to provide the notification.

15. The method according to claim 14, wherein said executing further comprises:

in response to determining the first number of light-receiving units being zero, not transmitting the instruction to provide the notification.

16. A non-transitory computer readable storage medium storing a control program which, when executed by a mobile device, causes the mobile device to determine a magnitude of a light volume of light entering a first solar panel, which includes a plurality of first photoelectric converters, for each of the plurality of the first photoelectric converters, the plurality of the first photoelectric converters configured to generate electrical power based on light entering from a first surface of an outer package of the mobile device and being disposed side by side, determine a first number of light-receiving units which is a total number of first photoelectric converters among the plurality of first photoelectric converters receiving a first light volume, the first light volume determined to be larger than a first predetermined value, and execute notification processing of transmitting an instruction to provide a notification based on the first number of light-receiving units, wherein the control program causes the mobile device to in response to determining the first number of light-receiving units being less than a reference value, transmit the instruction to provide the notification.

17. The non-transitory computer readable storage medium according to claim 16, wherein the control program, when executed by the mobile device, causes the mobile device to, in response to determining the first number of light-receiving units being zero, not transmit the instruction to provide the notification.

* * * * *